United States Patent
Uno et al.

(10) Patent No.: US 12,166,006 B2
(45) Date of Patent: Dec. 10, 2024

(54) BONDING WIRE FOR SEMICONDUCTOR DEVICES

(71) Applicants: NIPPON STEEL Chemical & Material Co., Ltd., Tokyo (JP); NIPPON MICROMETAL CORPORATION, Saitama (JP)

(72) Inventors: Tomohiro Uno, Tokyo (JP); Tetsuya Oyamada, Tokyo (JP); Daizo Oda, Saitama (JP); Motoki Eto, Saitama (JP)

(73) Assignees: NIPPON STEEL Chemical & Material Co., Ltd., Tokyo (JP); NIPPON MICROMETAL CORPORATION, Saitama (JP)

( * ) Notice: Subject to any disclaimer, the term of this patent is extended or adjusted under 35 U.S.C. 154(b) by 0 days.

(21) Appl. No.: 18/685,871

(22) PCT Filed: Oct. 18, 2022

(86) PCT No.: PCT/JP2022/038688
§ 371 (c)(1),
(2) Date: Feb. 22, 2024

(87) PCT Pub. No.: WO2023/248491
PCT Pub. Date: Dec. 28, 2023

(65) Prior Publication Data
US 2024/0266313 A1    Aug. 8, 2024

(30) Foreign Application Priority Data
Jun. 24, 2022 (JP) ................. 2022-101611

(51) Int. Cl.
*H01L 23/00* (2006.01)
*G01N 23/203* (2006.01)
*G01N 23/2276* (2018.01)

(52) U.S. Cl.
CPC .............. *H01L 24/45* (2013.01); *H01L 24/43* (2013.01); *G01N 23/203* (2013.01); *G01N 23/2276* (2013.01); *G01N 2223/601* (2013.01); *G01N 2223/602* (2013.01); *G01N 2223/611* (2013.01); *H01L 2224/4321* (2013.01); *H01L 2224/437* (2013.01); *H01L 2224/43825* (2013.01); *H01L 2224/43848* (2013.01); *H01L 2224/45147* (2013.01); *H01L 2224/45541* (2013.01); *H01L 2224/45644* (2013.01); *H01L 2224/45655* (2013.01); *H01L 2224/45664* (2013.01); *H01L 2924/01005* (2013.01); *H01L 2924/01012* (2013.01); *H01L 2924/01015* (2013.01); *H01L 2924/01031* (2013.01); *H01L 2924/01032* (2013.01); *H01L 2924/01033* (2013.01); *H01L 2924/01034* (2013.01); *H01L 2924/01047* (2013.01); *H01L 2924/01049* (2013.01); *H01L 2924/01051* (2013.01); *H01L 2924/01052* (2013.01); *H01L 2924/3512* (2013.01); *H01L 2924/365* (2013.01)

(58) Field of Classification Search
CPC ..... H01L 24/42–49; H01L 2224/45644; H01L 2224/45655; H01L 2224/45664; H01L 2224/45147; H01L 2224/45573; G01N 23/203; G01N 23/2276
See application file for complete search history.

(56) References Cited

U.S. PATENT DOCUMENTS

| | | |
|---|---|---|
| 2007/0235887 A1 | 10/2007 | Kaimori et al. |
| 2009/0188696 A1 | 7/2009 | Uno et al. |
| 2010/0282495 A1 | 11/2010 | Uno et al. |
| 2016/0315063 A1 | 10/2016 | Uno et al. |
| 2017/0040281 A1 | 2/2017 | Oyamada et al. |
| 2017/0117244 A1 | 4/2017 | Yamada et al. |
| 2017/0179064 A1 | 6/2017 | Yamada et al. |
| 2017/0200690 A1 | 7/2017 | Yamada et al. |

(Continued)

FOREIGN PATENT DOCUMENTS

| | | |
|---|---|---|
| CN | 105762129 A | 3/2018 |
| CN | 112376090 A | 2/2021 |

(Continued)

OTHER PUBLICATIONS

International Search Report issued in International Patent Application No. PCT/JP2022/038688, dated Jan. 17, 2023 w/English Translation.
JP Decision to Grant a Patent issued in corresponding Japanese Patent Application No. 2023-509507, dated May 9, 2023 w/English Translation.
Extended European Search Report issued in the corresponding European Application No. 22948050.4 dated Oct. 21, 2024.

*Primary Examiner* — David A Zarneke
(74) *Attorney, Agent, or Firm* — Rimon P.C.

(57) ABSTRACT

A bonding wire includes a core material of Cu or Cu alloy, and a coating layer containing a conductive metal other than Cu on a surface of the core material. In a concentration profile in a depth direction of the wire obtained, an average value of sum of a Pd concentration $C_{Pd}$ (atomic %) and an Ni concentration $C_{Ni}$ (atomic %) for measurement points in the coating layer is 50 atomic % or more, an average value of a ratio of $C_{Pd}$ to $C_{Ni}$ for measurement points in the coating layer is from 0.2 to 20 and a thickness of the coating layer is from 20 nm to 180 nm. An Au concentration $C_{Au}$ at a surface of the wire is from 10 atomic % to 85 atomic %. An average size of crystal grains in a circumferential direction of the wire is from 35 nm to 200 nm.

9 Claims, 1 Drawing Sheet

(56) References Cited

U.S. PATENT DOCUMENTS

| | | | |
|---|---|---|---|
| 2019/0164927 A1 | 5/2019 | Yamada et al. |
| 2020/0013747 A1 | 1/2020 | Yamada et al. |
| 2020/0013748 A1 | 1/2020 | Yamada et al. |
| 2020/0312808 A1 | 10/2020 | Oda et al. |
| 2023/0018430 A1 | 1/2023 | Oda et al. |
| 2023/0215834 A1 | 7/2023 | Oda et al. |
| 2023/0245995 A1 | 8/2023 | Oda et al. |
| 2023/0335528 A1 | 10/2023 | Oda et al. |
| 2023/0387066 A1 | 11/2023 | Oda et al. |

FOREIGN PATENT DOCUMENTS

| | | |
|---|---|---|
| JP | S61-048543 A | 3/1986 |
| JP | 2005-167020 A | 6/2005 |
| JP | 2006-190763 A | 7/2006 |
| JP | 2009-140942 A | 6/2009 |
| JP | 2015-119004 A | 6/2015 |
| JP | 2018-503743 A | 2/2018 |
| JP | 7157279 B1 | 10/2022 |
| JP | 7157280 B1 | 10/2022 |
| WO | 2009/093554 A1 | 7/2009 |
| WO | 2016/189752 A1 | 12/2016 |
| WO | 2017/013796 A1 | 1/2017 |
| WO | 2017/221770 A1 | 12/2017 |

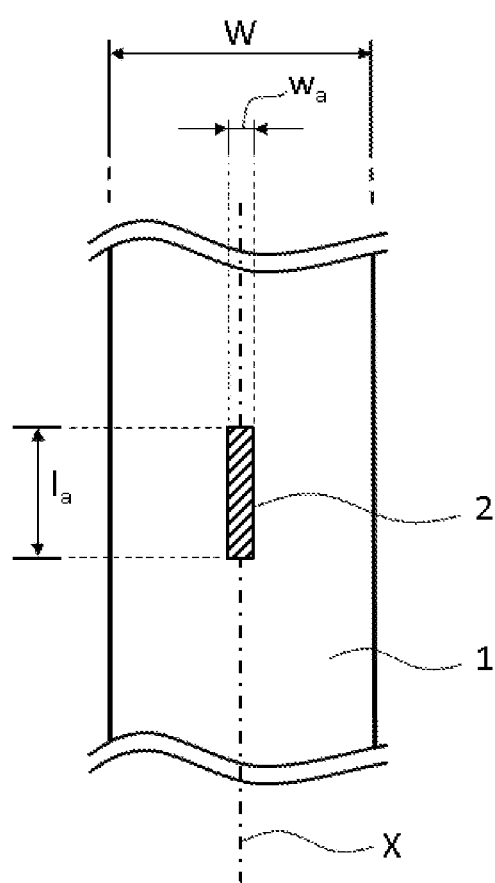

BONDING WIRE FOR SEMICONDUCTOR DEVICES

CROSS-REFERENCE TO RELATED APPLICATIONS

This application is the U.S. National Phase under 35 U.S.C. § 371 of International Application No. PCT/JP2022/038688, filed on Oct. 18, 2022, which claims the benefit of foreign priority to Japanese Patent Application No. 2022-101611, filed on Jun. 24, 2022, the entire contents of each of which are hereby incorporated by reference.

TECHNICAL FIELD

The present invention relates to a bonding wire for semiconductor devices. Furthermore, the present invention relates to a semiconductor device including the bonding wire.

BACKGROUND ART

In semiconductor devices, electrodes formed on a semiconductor chip are connected with electrodes on a lead frame or a substrate using a bonding wire. A bonding process of a bonding wire is carried out by performing 1st bonding of a wire part onto an electrode on the semiconductor chip; forming a loop; and finally performing 2nd bonding of a wire part onto an external electrode such as the lead frame or the electrode on the substrate. In the 1st bonding, a tip end of wire is heated and melted by arc heat input to form a free air ball (FAB: Free Air Ball; hereinafter also simply referred to as "ball") through surface tension, and then this ball part is compression-bonded (hereinafter referred to as "ball-bonded") onto the electrode on the semiconductor chip. In the 2nd bonding, the wire part is compression-bonded (hereinafter referred to as "wedge-bonded") onto the external electrode by applying ultrasonic waves and load to the wire part without forming the ball. After the bonding process, bonding parts are sealed with a sealing resin to obtain a semiconductor device.

Gold (Au) has been the common material of the bonding wire, but has been being replaced with copper (Cu) mainly for LSI use (e.g., Patent Literatures 1 to 3). Meanwhile, for on-vehicle device use on the background of recent proliferation of electric vehicles and hybrid vehicles, and further for power device (power semiconductor device) use in large power equipment such as air conditioners and photovoltaic power generation systems, there has been a growing demand for replacement with Cu that has high efficiency and reliability due to its high thermal conductivity and fusing current characteristic.

Cu has the drawback of being more susceptible to oxidation than Au. As a method of preventing the surface oxidation of the Cu bonding wire, there has been proposed a structure in which a surface of a Cu core material is coated with a metal such as Pd (Patent Literature 4). There has been also proposed a Pd-coated Cu bonding wire which has an improved bond reliability of the 1st bonding part by coating a surface of a Cu core material with Pd and adding Pd and Pt into the Cu core material (Patent Literature 5).

RELATED ART REFERENCE

Patent Literature

Patent Literature 1: JP-A-S61-48534
Patent Literature 2: JP-T-2018-503743
Patent Literature 3: WO 2017/221770
Patent Literature 4: JP-A-2005-167020
Patent Literature 5: WO 2017/013796

SUMMARY OF INVENTION

Problem to be Solved by the Invention

The on-vehicle devices and the power devices tend to be exposed to higher temperature as compared with general electronic devices during operation, and the bonding wire used therefor is required to exhibit a favorable bond reliability under a rigorous high-temperature environment.

The present inventors have conducted the evaluation based on characteristics required for the on-vehicle devices and the power devices and found that, in a conventional Cu bonding wire having a Pd-coating layer, the Pd-coating layer may sometimes be partially exfoliated during the bonding process of the wire, thereby causing exposure of the Cu core material, and as a result, a contact area between the Pd-coating part and the Cu-exposed part is exposed to an environment containing oxygen, water vapor, and sulfur compound-based outgas generated from a sealing resin under the high-temperature environment, resulting in local corrosion of Cu, that is, galvanic corrosion, which makes it difficult to sufficiently achieve the bond reliability of the 2nd bonding part. The present inventor confirmed that it is difficult to reduce a galvanic corrosion to improve the bond reliability of the 2nd bonding part, particularly in a case where the wire has a small diameter (especially, a diameter of 18 μm or less) or in a case where the wire is exposed to higher temperature environment (especially, 190° C. or more).

An object of the present invention is to provide a novel Cu bonding wire that reduces a galvanic corrosion in a rigorous high-temperature environment to achieve a favorable bond reliability of the 2nd bonding part.

Means for Solving Problem

As a result of earnest investigation as to the problem described above, the present inventors have found that the problem described above can be solved by the bonding wire having the configuration described below, and completed the present invention.

That is, the present invention includes the following content.

[1] A bonding wire for semiconductor devices, the bonding wire comprising:
  a core material of Cu or Cu alloy; and
  a coating layer containing a conductive metal other than Cu formed on a surface of the core material, wherein
  in a concentration profile in a depth direction of the wire obtained by performing measurement using Auger electron spectroscopy (AES), an average value of sum of a Pd concentration $C_{Pd}$ (atomic %) and an Ni concentration $C_{Ni}$ (atomic %), $C_{Pd}+C_{Ni}$, for measurement points in the coating layer is 50 atomic % or more, an average value of a ratio of $C_{Pd}$ to $C_{Ni}$, $C_{Pd}/C_{Ni}$, for measurement points in the coating layer is 0.2 or more and 20 or less and a thickness dt of the coating layer is 20 nm or more and 180 nm or less,
  an Au concentration $C_{Au}$ at a surface of the wire is 10 atomic % or more and 85 atomic % or less, and
  an average size of crystal grains in a circumferential direction of the wire is 35 nm or more and 200 nm or less when the surface of the wire is analyzed by using an Electron Backscattered Diffraction (EBSD) method.

[2] The bonding wire according to [1], wherein in the concentration profile in the depth direction of the wire obtained by performing the measurement using AES, a thickness da of a region where an Au concentration $C_{Au}$ is 10 atomic % or more is 0.5 nm or more and 25 nm or less.

[3] The bonding wire according to [1] or [2], wherein when measuring crystal orientations on the surface of the wire by using the EBSD method, a crystal orientation <111> angled at 15° or less to a wire longitudinal direction has a proportion of 30% or more and 95% or less among crystal orientations in the wire longitudinal direction.

[4] The bonding wire according to any one of [1] to [3], wherein the concentration profile in the depth direction of the wire is obtained by performing the measurement using AES under the following <Condition> while digging down the wire from its surface in the depth direction by Ar sputtering:

<Condition> a center of width of a measuring surface is aligned with a center of width of the wire, the width of the measuring surface is 5% or more and 15% or less of a diameter of the wire, and a length of the measuring surface is five times the width of the measuring surface.

[5] The bonding wire according to any one of [1] to [4], wherein the concentration of Au at the surface of the wire is measured using AES under the following <Condition>:

<Condition> a center of width of a measuring surface is aligned with a center of width of the wire, the width of the measuring surface is 5% or more and 15% or less of a diameter of the wire, and a length of the measuring surface is five times the width of the measuring surface.

[6] The bonding wire according to any one of [1] to [5], wherein
the bonding wire contains one or more elements selected from the group consisting of B, P, In and Mg (hereinafter referred to as a "first additive element"), and
a total concentration of the first additive element is 1 ppm by mass or more and 100 ppm by mass or less relative to the entire wire.

[7] The bonding wire according to any one of [1] to [6], wherein
the bonding wire contains one or more elements selected from the group consisting of Se, Te, As and Sb (hereinafter referred to as a "second additive element"), and
a total concentration of the second additive element is 1 ppm by mass or more and 100 ppm by mass or less relative to the entire wire.

[8] The bonding wire according to any one of [1] to [7], wherein
the bonding wire contains one or more elements selected from the group consisting of Ga, Ge and Ag (hereinafter referred to as a "third additive element"), and
a total concentration of the third additive element is 0.011% by mass or more and 1.5% by mass or less relative to the entire wire.

[9] A semiconductor device comprising the bonding wire according to any one of [1] to [8].

Effect of the Invention

The present invention can provide the novel Cu bonding wire that reduces a galvanic corrosion in a rigorous high-temperature environment to achieve a favorable bond reliability of the 2nd bonding part.

BRIEF DESCRIPTION OF DRAWINGS

FIG. 1 is a schematic view illustrating a position and dimensions of a measuring surface for performing a composition analysis using AES.

EMBODIMENT FOR CARRYING OUT THE INVENTION

Hereinafter, the present invention will be described in detail with reference to preferable embodiments thereof. A Drawing may be referred to during the explanation. However, note that the drawing schematically shows the shape, size and arrangement of constituent elements only to the extent that the invention can be understood. The present invention is not limited to the following embodiments and examples and may be modified for implementation within the scope not departing from the scope of claims of the present invention and their equivalents.

[Bonding Wire for Semiconductor Devices]

A bonding wire for semiconductor devices according to the present invention (hereinafter also simply referred to as "wire of the present invention" or "wire") is characterized in that the bonding wire includes:
a core material of Cu or Cu alloy; and
a coating layer containing a conductive metal other than Cu formed on a surface of the core material, wherein
in a concentration profile in a depth direction of the wire obtained by performing measurement using Auger electron spectroscopy (AES), an average value of sum of a Pd concentration $C_{Pd}$ (atomic %) and an Ni concentration $C_{Ni}$ (atomic %), $C_{Pd}+C_{Ni}$, for measurement points in the coating layer is 50 atomic % or more, an average value of a ratio of $C_{Pd}$ to $C_{Ni}$, $C_{Pd}/C_{Ni}$, for measurement points in the coating layer is 0.2 or more and 20 or less and a thickness dt of the coating layer is 20 nm or more and 180 nm or less,
an Au concentration $C_{Au}$ at a surface of the wire is 10 atomic % or more and 85 atomic % or less, and
an average size of crystal grains in a circumferential direction of the wire is 35 nm or more and 200 nm or less when the surface of the wire is analyzed by using an Electron Backscattered Diffraction (EBSD) method.

As described above, the bonding wires used for the on-vehicle devices and the power devices are required to exhibit a favorable bond reliability under a rigorous high-temperature environment. For example, the bonding wires used for the on-vehicle devices require the bond reliability in a high-temperature environment exceeding 150° C. The present inventors have conducted the evaluation based on the characteristics required for the on-vehicle devices and the like and found that, in some cases, the conventional Cu bonding wires with the Pd-coating layers cause a galvanic corrosion in a high-temperature environment and fail to sufficiently achieve the bond reliability of the 2nd bonding parts. Especially when the wire has a small diameter (especially, a diameter of 18 μm or less), the bond reliability of the 2nd bonding part easily deteriorates because a volumetric effect of the region where the galvanic corrosion occurs tends to become large.

In this regard, the characteristics required for the on-vehicle devices and the like are becoming more and more severe, and there is a demand for reliable operations at a higher temperature. In order to evaluate the bond reliability of the bonding wire in a high-temperature environment, a High Temperature Storage Life Test (HTSL) is often performed in which the wire is exposed to an environment with a temperature of 175° C. by assuming a rigorous high-temperature environment. The present inventors have performed HTSL with a temperature of 200° C. by assuming a more rigorous high-temperature environment. As a result, it has been found that even the bonding wire that achieves a favorable bond reliability of the 2nd bonding part at a temperature of 175° C. tends to lose the bond reliability of the 2nd bonding part at a temperature of 200° C. In a high-temperature environment of 200° C., the temperature exceeds glass transition temperatures of most sealing resins and thus a denaturation or degradation of the resin progresses and the amount of oxygen, water vapor and sulfur compound-based outgas generated from the sealing resin tends to increase significantly. Thus, the HTSL with a temperature of 200° C. is a rigorous test in which the corrosion is accelerated.

In contrast, the present inventors have found that a favorable bond reliability of the 2nd bonding part can be achieved even in a case where the wire has a small diameter or in a case where the wire is exposed to a rigorous high-temperature environment of 200° ° C., by using a bonding wire that includes:

a core material of Cu or Cu alloy; and a coating layer containing a conductive metal other than Cu formed on a surface of the core material, wherein in a concentration profile in a depth direction of the wire obtained by performing measurement using AES, an average value of sum of a Pd concentration $C_{Pd}$ (atomic %) and an Ni concentration $C_{Ni}$ (atomic %), $C_{Pd}+C_{Ni}$, for measurement points in the coating layer is 50 atomic % or more, an average value of a ratio of $C_{Pd}$ to $C_{Ni}$, $C_{Pd}/C_{Ni}$, for measurement points in the coating layer is 0.2 or more and 20 or less and a thickness dt of the coating layer is 20 nm or more and 180 nm or less, an Au concentration $C_{Au}$ at a surface of the wire is 10 atomic % or more and 85 atomic % or less, and an average size of crystal grains in a circumferential direction of the wire is 35 nm or more and 200 nm or less when the surface of the wire is analyzed by using an EBSD method. The present invention greatly contributes to putting a Cu bonding wire into practical use in on-vehicle devices and power devices.

<Core Material of Cu or Cu Alloy>

The wire of the present invention includes a core material of Cu or Cu alloy (hereinafter, also simply referred to as "Cu core material").

The Cu core material is not particularly limited as long as it is made of Cu or Cu alloy, and there may be used a known Cu core material constituting a conventional Pd-coated Cu wire which has been known as a bonding wire for semiconductor devices.

In the present invention, the concentration of Cu in the Cu core material may be, for example, 97 atomic % or more, 97.5 atomic % or more, 98 atomic % or more, 98.5 atomic % or more, 99 atomic % or more, 99.5 atomic % or more, 99.8 atomic % or more, 99.9 atomic % or more, or 99.99 atomic % or more in the center (axial core part) of the Cu core material.

The Cu core material may contain one or more dopants selected from the first additive element, the second additive element and the third additive element described later, for example. Preferable contents of these dopants are described later.

In a preferable embodiment, the Cu core material consists of Cu and inevitable impurities. In another embodiment, the Cu core material consists of Cu; one or more elements selected from the first additive element, the second additive element and the third additive element described later; and inevitable impurities. The term "inevitable impurities" used in relation to the Cu core material encompasses elements constituting the coating layer described later.

<Coating Layer>

The wire of the present invention includes a coating layer containing a conductive metal other than Cu (hereinafter, also simply referred to as a "coating layer") formed on a surface of the Cu core material.

In view of reducing a galvanic corrosion to achieve a favorable bond reliability of the 2nd bonding part even in a case where the wire has a small diameter or in a case where the wire is exposed to a rigorous high-temperature environment of 200° C., it is important for the coating layer of the wire of the present invention to satisfy all of the following conditions (1) to (3) in a concentration profile in the depth direction of the wire obtained by performing measurement using AES (hereinafter also simply referred to as "concentration profile in the depth direction of the wire"), and further the following conditions (4) and (5).

(1) An average value of sum of a Pd concentration $C_{Pd}$ (atomic %) and an Ni concentration $C_{Ni}$ (atomic %), $C_{Pd}+C_{Ni}$, for measurement points in the coating layer is 50 atomic? or more.

(2) An average value of a ratio of $C_{Pd}$ to $C_{Ni}$, $C_{Pd}/C_{Ni}$, for measurement points in the coating layer is 0.2 or more and 20 or less.

(3) A thickness dt of the coating layer is 20 nm or more and 180 nm or less.

(4) An Au concentration $C_{Au}$ at a surface of the wire is 10 atomic % or more and 85 atomic % or less.

(5) An average size of crystal grains in a circumferential direction of the wire (hereinafter also simply referred to as "width of crystal grain") is 35 nm or more and 200 nm or less when the surface of the wire is analyzed by using an EBSD method.

In the present invention, when obtaining the concentration profile in the depth direction of the wire by using AES, the measurement is preferably performed so that the number of measurement points in the depth direction is 50 or more for the coating layer. In general, an analysis in the depth direction using AES can be performed at measurement intervals of sub-nano order, thus it is relatively easy to set the number of the measurement points to 50 or more in relation to the thickness of the coating layer of the present invention. If the number of the measurement points is less than 50 as a result of the measurement, the number of the measurement points is increased to 50 or more by lowering the sputtering rate, shortening the sputtering time, and the like, and then the measurement is performed again. This makes it possible to perform the measurement using AES so that the number of measurement points in the depth direction is 50 or more for the coating layer and obtain the concentration profile in the depth direction of the wire. Accordingly, in a preferable embodiment, the coating layer of the wire of the present invention satisfies the above-mentioned conditions (1) to (3) in the concentration profile in the depth direction of the wire obtained by performing the measurement using AES in that the number of measurement points in the depth direction is 50 or more for the coating layer.

—Condition (1)—

The condition (1) relates to the average value of sum of a Pd concentration $C_{Pd}$ (atomic %) and an Ni concentration $C_{Ni}$ (atomic %), $C_{Pd}+C_{Ni}$, for measurement points in the coating layer.

By including the coating layer that satisfies the condition (1) in combination with the conditions (2) and (3), the wire of the present invention can reduce a galvanic corrosion to achieve a favorable bond reliability of the 2nd bonding part even in a case where the wire has a small diameter or in a case where the wire is exposed to a rigorous high-temperature environment of 200° C.

Regarding the condition (1), the average value of the sum $C_{Pd}+C_{Ni}$ is 50 atomic % or more, preferably 55 atomic % or more, more preferably 60 atomic % or more, from the viewpoint of reducing a galvanic corrosion to achieve a favorable bond reliability of the 2nd bonding part even in a rigorous high-temperature environment. When the average value is less than 50 atomic %, the bond reliability of the 2nd bonding part in a high-temperature environment tends to deteriorate. Although the upper limit of the average value is not particularly limited as long as the conditions (2) to (5) are satisfied, it is usually 95 atomic % or less, preferably 94 atomic % or less, 92 atomic? or less, or 90 atomic % or less.
—Condition (2)—

The condition (2) relates to the ratio of the Pd concentration $C_{Pd}$ (atomic %) to the Ni concentration $C_{Ni}$ (atomic %), $C_{Pd}/C_{Ni}$, for measurement points in the coating layer.

By including the coating layer that satisfies the condition (2) in combination with the conditions (1), (3) to (5), the wire of the present invention can reduce a galvanic corrosion to achieve a favorable bond reliability of the 2nd bonding part even in a case where the wire has a small diameter or in a case where the wire is exposed to a rigorous high-temperature environment of 200° C.

Regarding the condition (2), the average value of the ratio $C_{Pd}/C_{Ni}$ is 20 or less, preferably 15 or less, more preferably 14 or less, 12 or less, or 10 or less, from the viewpoint of achieving a favorable bond reliability of the 2nd bonding part in a high-temperature environment. When the average value of the ratio $C_{Pd}/C_{Ni}$ is more than 20, the galvanic corrosion cannot be reduced, thereby often making it difficult to achieve a favorable high-temperature bond reliability of the 2nd bonding part in a case where the wire has a small diameter or in a case where the wire is exposed to a rigorous high temperature environment of 200° C. Furthermore, the lower limit of the average value of the ratio $C_{Pd}/C_{Ni}$ is 0.2 or more, preferably 0.4 or more, 0.5 or more, or 0.6 or more, more preferably 0.8 or more, 1.0 or more, or more than 1.0, from the viewpoint of achieving a favorable bond reliability of the 2nd bonding part in a high-temperature environment.
—Condition (3)—

The condition (3) relates to the thickness of the coating layer. By including the coating layer that satisfies the condition (3) in combination with the conditions (1), (2), (4) and (5), the wire of the present invention can reduce a galvanic corrosion to achieve a favorable bond reliability of the 2nd bonding part even in a case where the wire has a small diameter or in a case where the wire is exposed to a rigorous high-temperature environment of 200° C.

Regarding the condition (3), the thickness dt of the coating layer (the calculation method based on the concentration profile in the depth direction of the wire will be described below) is 20 nm or more, preferably 25 nm or more, 30 nm or more, 32 nm or more, 34 nm or more, 36 nm or more, or 38 nm or more, more preferably 40 nm or more, 45 nm or more, 50 nm or more, or 55 nm or more, further preferably 60 nm or more, 65 nm or more, or 70 nm or more, from the viewpoint of achieving a favorable bond reliability of the 2nd bonding part in a high-temperature environment. When the thickness dt of the coating layer is less than 20 nm, the galvanic corrosion cannot be reduced, thereby often making it difficult to achieve a favorable high-temperature bond reliability of the 2nd bonding part in a case where the wire has a small diameter or in a case where the wire is exposed to a rigorous high temperature environment of 200° C. Furthermore, the upper limit of the thickness dt of the coating layer is 180 nm or less, preferably 170 nm or less, 160 nm or less, or 150 nm or less, more preferably 140 nm or less, 135 nm or less, or 130 nm or less, from the viewpoint of achieving a favorable bond reliability of the 2nd bonding part in a high-temperature environment. When the thickness of the coating layer is more than 180 nm, the galvanic corrosion cannot be reduced, thereby often making it difficult to achieve a favorable high-temperature bond reliability of the 2nd bonding part in a case where the wire has a small diameter or in a case where the wire is exposed to a rigorous high temperature environment of 200° C.

The average value of the sum $C_{Pd}+C_{Ni}$ in the condition (1), the average value of the ratio $C_{Pd}/C_{Ni}$ in the condition (2) and the thickness dt of the coating layer in the condition (3) can be confirmed and determined by performing a composition analysis using AES while digging down the wire from its surface in the depth direction (direction to the center of the wire) by Ar sputtering. Specifically, a change in concentration of each element in the direction from the surface of the wire toward the depth (center) of the wire (so-called a concentration profile in the depth direction) is obtained by performing 1) a composition analysis of the wire surface, and then repeating 2) a sputtering treatment with Ar and 3) a surface composition analysis after the sputtering treatment, and the above factors can be confirmed and determined on the basis of the concentration profile. In the present invention, for obtaining the concentration profile in the depth direction, the unit of depth was in terms of $SiO_2$.

When performing 1) the composition analysis of the wire surface and 3) the surface composition analysis after the sputtering treatment, a position and dimensions of a measuring surface are determined as follows. In the following description, the width of the measuring surface indicates the dimension of the measuring surface in a direction perpendicular to a wire axis (a thickness direction of the wire, a circumferential direction of the wire), and the length of the measuring surface indicates the dimension of the measuring surface in a direction along the wire axis (a length direction of the wire, a wire longitudinal direction). A further description will be provided with reference to FIG. 1. FIG. 1 is a schematic plan view illustrating a wire 1 in which the direction of the wire axis (the length direction of the wire) corresponds to the vertical direction (up-down direction) of FIG. 1 and the direction perpendicular to the wire axis (the thickness direction of the wire) corresponds to the horizontal direction (left-right direction) of FIG. 1. FIG. 1 shows a measuring surface 2 in relation to the wire 1. The width of the measuring surface 2 is represented by a dimension $w_a$ of the measuring surface in the direction perpendicular to the wire axis, and the length of measuring surface 2 is represented by a dimension $l_a$ of the measuring surface in the direction of the wire axis. The meanings of the "width of the measuring surface" and the "length of the measuring surface" regarding the measuring surface are the same for the analysis by EBSD method in the condition (5) described later.

When measuring with AES, the measuring surface is determined so that a center of width of the measuring surface is aligned with a center of width of the wire in the direction perpendicular to the wire axis, and the width of the measuring surface is 5% or more and 15% or less of a diameter of the wire. The length of the measuring surface is set to be five times the width of the measuring surface. In FIG. 1, the width of the wire is indicated by a symbol W, and the center of the width of the wire is indicated by a dashed line X. Thus, the measuring surface 2 is determined so that the center of width of the measuring surface 2 is aligned with the dashed line X indicating the center of width of the wire, and the width $w_a$ of the measuring surface is 5% or more and 15% or less of the diameter of the wire (the same value as the width W of the wire), that is, 0.05 W or more and 0.15 W or less. Further, the length $l_a$ of the measuring surface satisfies the relation of $l_a = 5w_a$. By determining the position and dimensions of the measuring surface as described above, it is possible to measure with good accuracy whether it meets the conditions (1) to (3), which are required for reducing a galvanic corrosion to achieve a favorable bond reliability of the 2nd bonding part even in a case where the wire has a small diameter or in a case where the wire is exposed to a rigorous high-temperature environment of 200° C.

There will be described a tendency of the concentration profile in the depth direction obtained for the wire of the present invention according to an embodiment. From the surface of the wire to a very shallow position in the concentration profile in the depth direction, the concentration of Au tends to be decreased and the concentration of Pd and Ni tends to be increased (the condition for Au is described later in relation to the condition (4)). Proceeding in the depth direction up to a certain depth position, Pd and Ni tend to coexist at a certain ratio in a high concentration. Further proceeding in the depth direction, the concentration of Pd and Ni tends to be decreased and the concentration of Cu tends to be increased.

By focusing on the concentration of the core material Cu, $C_{Cu}$ (atomic %), in such a concentration profile in the depth direction, it is possible to determine a boundary between the Cu core material and the coating layer and thus to obtain the thickness dt of the coating layer and the measurement points of the coating layer. Firstly, a boundary between the Cu core material and the coating layer is determined based on the concentration $C_{Cu}$. The position at which the concentration $C_{Cu}$ is 50 atomic % is determined as the boundary, and then a region where the concentration $C_{Cu}$ is 50 atomic % or more is determined to be the Cu core material and a region where the concentration $C_{Cu}$ is less than 50 atomic % is determined to be the coating layer. In the present invention, the boundary between the Cu core material and the coating layer is not necessarily a crystal grain boundary. Secondly, the thickness of the coating layer can be determined, by confirming the concentration profile from the wire surface toward the center of the wire, as a distance from a wire surface position Z0 to a depth position Z1 where the concentration of the core material Cu, $C_{Cu}$, reaches 50 atomic % for the first time. Measurement points from the wire surface position zo to the depth position Z1 correspond to the measurement points of the coating layer. In the present invention, for determining the thickness of the coating layer based on the concentration profile in the depth direction, the unit of depth was in terms of $SiO_2$. Further, it is preferable to perform the measurement for measuring surfaces at a plurality of points (n≥3) which are separated from each other by 1 mm or more in the wire longitudinal direction, and employ an arithmetic average value thereof.

Further, by focusing on the Pd concentration $C_{Pd}$ (atomic %) and the Ni concentration $C_{Ni}$ (atomic %) in such a concentration profile in the depth direction, it is possible to obtain the average value of the sum $C_{Pd}+C_{Ni}$ by arithmetically averaging the sum of $C_{Pd}$ and $C_{Ni}$ for all measurement points in the coating layer. Further, the average value of a ratio $C_{Pd}/C_{Ni}$ can be obtained by arithmetically averaging the ratio $C_{Pd}/C_{Ni}$ for all measurement points in the coating layer.

The average value of the sum $C_{Pd}+C_{Ni}$ in the condition (1), and the average value of the ratio $C_{Pd}/C_{Ni}$ in the condition (2) are based on results of measurement under the conditions described in [Thickness analysis of coating layer using Auger electron spectroscopy (AES)] described later.

—Condition (4)—

The condition (4) relates to an Au concentration $C_{Au}$ (atomic %) at the surface of the wire.

By including the coating layer that satisfies the condition (4) in combination with the conditions (1) to (3) and (5), the wire of the present invention can reduce a galvanic corrosion to achieve a favorable bond reliability of the 2nd bonding part even in a case where the wire has a small diameter or in a case where the wire is exposed to a rigorous high-temperature environment of 200° C.

Regarding the condition (4), from the viewpoint of achieving a favorable bond reliability of the 2nd bonding part in a high-temperature environment, the Au concentration $C_{Au}$ at the surface of the wire of the present invention is 10 atomic % or more, preferably 15 atomic % or more, more preferably 20 atomic % or more, further preferably 25 atomic % or more, further more preferably 30 atomic % or more, 32 atomic % or more, 34 atomic % or more, 35 atomic % or more, 36 atomic % or more, 38 atomic % or more, or 40 atomic % or more. When the concentration $C_{Au}$ is less than 10 atomic %, the galvanic corrosion cannot be reduced in a case where the wire has a small diameter or in a case where the wire is exposed to a rigorous high-temperature environment of 200° C., thereby often making it difficult to achieve sufficient high-temperature bond reliability of the 2nd bonding part. From the viewpoint of achieving a favorable bond reliability of the 2nd bonding part in a high-temperature environment, the upper limit of the concentration $C_{Au}$ is 85 atomic % or less, preferably 80 atomic % or less, 78 atomic % or less, or 76 atomic % or less, more preferably 75 atomic % or less, 74 atomic % or less, 72 atomic % or less, or 70 atomic % or less. When the concentration $C_{Au}$ is more than 85 atomic %, the galvanic corrosion cannot be reduced in a case where the wire has a small diameter or in a case where the wire is exposed to a rigorous high-temperature environment of 200° ° C., thereby often making it difficult to achieve sufficient high-temperature bond reliability of the 2nd bonding part.

The Au concentration $C_{Au}$ at the surface of the wire in the condition (4) can be determined by performing the composition analysis of the wire surface as a measuring surface using an Auger electron spectroscopy (AES) method. Herein, when determining the Au concentration at the surface of the wire, a gas component such as carbon (C), sulfur (S), oxygen (O) and nitrogen (N), a non-metal element, and the like are not considered.

The composition analysis of the wire surface can be performed under the same conditions as in 1) the composition analysis of the wire surface described in relation to the method of obtaining the concentration profile in the depth direction. Specifically, when performing the composition analysis of the wire surface using Auger electron spectroscopy (AES), the position and dimensions of the measuring surface are determined as follows.

The measuring surface is determined so that a center of width of the measuring surface is aligned with a center of width of the wire in the direction perpendicular to the wire axis, and the width of the measuring surface is 5% or more and 15% or less of a diameter of the wire. The length of the measuring surface is set to be five times the width of the measuring surface. By determining the position and dimensions of the measuring surface as described above, it is possible to measure the concentration of Au at the surface that is required for reducing a galvanic corrosion to achieve a favorable bond reliability of the 2nd bonding part even in a case where the wire has a small diameter or in a case where the wire is exposed to a rigorous high-temperature environment of 200° C. It is preferable to perform the measurement for measuring surfaces at a plurality of points (n≥3) which are separated from each other by 1 mm or more in the wire longitudinal direction, and employ an arithmetic average value thereof.

The Au concentration $C_{Au}$ at the surface of the wire in the condition (4) is based on a result of measurement under the conditions described in [Composition analysis of wire surface using Auger electron spectroscopy (AES)].

—Condition (5)—

The condition (5) relates to an average size of crystal grains in a circumferential direction of the wire ("width of crystal grain") obtained by analyzing the surface of the wire using an EBSD method.

By including the coating layer that satisfies the condition (5) in combination with the conditions (1) to (4), the wire of the present invention can reduce a galvanic corrosion to achieve a favorable bond reliability of the 2nd bonding part even in a case where the wire has a small diameter or in a case where the wire is exposed to a rigorous high-temperature environment of 200° C. The crystal grains at the surface of the wire form a structure elongated in the wire longitudinal direction. The present inventors have investigated and found that the reduction of the width of crystal grain, which is an average size of crystal grains in a circumferential direction of the wire, is effective for improving the bond reliability of the 2nd bonding part. In contrast, the present inventors have confirmed that the bond reliability of the 2nd bonding part is hard to be improved by controlling an average length of crystal grains in the wire longitudinal direction or an average diameter of crystal grains in terms of circle-equivalent diameter.

Regarding the condition (5), from the viewpoint of achieving a favorable bond reliability of the 2nd bonding part in a high-temperature environment, the width of crystal grain obtained by analyzing the surface of the wire of the present invention using the EBSD method is 200 nm or less, preferably 180 nm or less, 160 nm or less, or 150 nm or less, more preferably 140 nm or less, or 130 nm or less, further preferably 120 nm or less, 115 nm or less, or 110 nm or less. When the width of crystal grain is 140 nm or less, it is preferable because more favorable bond reliability of the 2nd bonding part can be readily achieved in a high-temperature environment. In particular, when the width of crystal grain is 120 nm or less, the present inventors have confirmed that particularly favorable bond reliability of the 2nd bonding part can be readily achieved even in a case where the wire has a small diameter or in a case where the wire is exposed to a rigorous high-temperature environment of 200° C.

As described above, the present inventors have found that even the wire that does not cause a problem in a high-temperature heating of 175° C., which is a traditional condition for evaluating the bond reliability, often causes a problem in a high-temperature heating of 200° C. In contrast, by reducing the width of crystal grain into a certain range to satisfy the condition (5) in combination with the conditions (1) to (4), the present inventors have found that it is possible to achieve a particularly excellent effect of reducing a galvanic corrosion to achieve a favorable bond reliability of the 2nd bonding part even in a case where the wire is exposed to a rigorous high-temperature environment of 200° C.

Although it is not clear why the wire of the present invention achieves such effect, it is inferred as follows. Specifically, as for the Cu-based bonding wire that includes the coating layer mainly containing Pd and Ni at a certain ratio as well as containing Au at surface thereof so as to satisfy the conditions (1) to (4), if the width of crystal grain at the surface of the wire is equal to or less than a certain value, a galvanic corrosion can be reduced remarkably even in a high-temperature environment by, for example, suppressing the breakage of the coating layer at the time of 2nd bonding. Regarding the effect of improving the bond reliability of the 2nd bonding part relating to a galvanic corrosion, a water resistance and the like which is provided by an alloy containing Pd and Ni (hereinafter also referred to as a "Pd—Ni containing alloy"), it is effective to decrease the width of crystal grain of the Pd—Ni containing alloy into a certain range. In this regard, in a case of the coating layer containing only Pd, it is confirmed that the bond reliability of the 2nd bonding part is not improved even when the width of crystal grain is decreased into a certain range. It is therefore revealed that the above-mentioned effect provided by decreasing the width of crystal grain into a certain range is specifically expressed for the Pd—Ni containing alloy.

From the viewpoint of achieving a favorable bond reliability of the 2nd bonding part in a high-temperature environment and achieving a favorable compression-bonding shape of the 1st bonding part, the lower limit of the width of crystal grain is 35 nm or more, preferably 40 nm or more, 42 nm or more, or 44 nm or more, more preferably 45 nm or more, 46 nm or more, or 48 nm or more, further preferably 50 nm or more, 52 nm or more, 54 nm or more, or 55 nm or more. When the width of crystal grain is less than 35 nm, the bond reliability of the 2nd bonding part in a high-temperature environment tends to be deteriorated. Further, when the width of crystal grain is less than 35 nm, it is confirmed that the compression-bonding shape of the 1st bonding part also readily deteriorates.

The width of crystal grain at the surface of the wire in the condition (5) is obtained by analyzing the surface of the wire using an Electron Backscattered Diffraction (EBSD) method. A device used for the EBSD method is configured by a scanning electron microscope and a detector mounted thereon. The EBSD method is a method for determining the crystal orientation at each measurement point by projecting, on the detector, a diffraction pattern of a reflected electron that is generated when an electron beam is emitted to a sample, and analyzing the diffraction pattern. For analysis of data obtained by the EBSD method, analysis software attached to the device (OIM analysis and the like manufactured by TSL solutions) can be used.

When performing the measurement of the width of crystal grain at the surface of the wire using the EBSD method, the position and dimensions of the measuring surface are determined as follows.

First, the bonding wire to be measured is fixed to a sample holder in a linear arrangement. Next, the measuring surface is determined so that a center of width of the measuring surface is aligned with a center of width of the wire in the direction perpendicular to the wire axis, and the width of the measuring surface is 20% or more and 40% or less of a diameter of the wire. By determining the position and dimensions of the measuring surface as described above, it is possible to suppress an influence of curvature of the wire surface to measure the width of crystal grain at the surface of the wire, which is required for reducing a galvanic corrosion to achieve a favorable bond reliability of the 2nd bonding part even in a case where the wire has a small diameter or in a case where the wire is exposed to a rigorous high-temperature environment of 200° C., with high accuracy. The length of the measuring surface may be set to be from 2 times to 5 times the width of the measuring surface. It is preferable to measure under the condition where the measuring magnification is from 5,000 times to 20,000 times and the interval of measurement points is from 0.02 μm to 0.05 μm.

There will be further described with reference to FIG. 1. As described above, in FIG. 1, the width of the wire is indicated by a symbol W, and the center of the width of the wire is indicated by a dashed line X. Thus, the measuring surface 2 is determined so that the center of width of the measuring surface 2 is aligned with the dashed line X indicating the center of width of the wire, and the width $w_a$ of the measuring surface is 20% or more and 40% or less of the diameter of the wire (the same value as the width W of the wire), that is, 0.2 W or more and 0.4 W or less. Further, the length $l_a$ of the measuring surface satisfies the relation of $2w_a \leq l_a \leq 5w_a$. By determining the position and dimensions of the measuring surface as described above, it is possible to suppress an influence of curvature of the wire surface to measure the width of crystal grain at the surface of the wire, which is required for reducing a galvanic corrosion to achieve a favorable bond reliability of the 2nd bonding part even in a case where the wire has a small diameter or in a case where the wire is exposed to a rigorous high-temperature environment of 200° C., with high accuracy.

When measuring the width of the surface of the wire by the EBSD method, it is preferable to perform a calculation by employing only the crystal orientation identified based on a certain reliability among the measuring surface while excluding a part in which the crystal orientation cannot be measured, a part in which the crystal orientation can be measured but reliability of orientation analysis is low, or the like, in order to avoid the influence of a contaminant, an adhering substance, an irregularity, a damage and the like. For example, when using OIM analysis manufactured by TSL solutions as an analysis software, it is preferable to analyze by excluding the measurement points in which the CI value (Confidence Index) is less than 0.1. In a case where the excluded data exceeds, for example, 30% of total, it is desirable to perform again from the preparation of a measurement sample because there is a possibility that the object to be measured was subjected to some contamination. Here, "crystal grain (s) at the surface of the wire" means not only crystal grains exposed at the surface of the wire but also crystal grains determined as crystal grains by the EBSD measurement.

When measuring the width of the surface of the wire by the EBSD method, it is also preferable to determine the width of the surface of the wire by defining the boundary at which an orientation difference between adjacent measurement points is 5° or more as the crystal grain boundary. The calculation of the width of crystal grain at the surface of the wire is generally conducted by: (i) drawing a line in the width direction of the measuring surface (the circumferential direction of the wire) to determine the size of each crystal grain in the circumferential direction of the wire from intervals of crystal grain boundaries on the line; and (ii) arithmetically averaging the size of each crystal grain in the circumferential direction of the wire to calculate the average size of crystal grains in the circumferential direction of the wire. This calculation is conducted for a plurality of lines (the number of lines N is preferably 10 or more, more preferably 20 or more) which are separated from each other in the wire longitudinal direction, and the average value thereof is employed as the width of crystal grain.

The width of crystal grain at the surface of the wire in the condition (5) is based on a result of measurement under the conditions described in [Crystal analysis of wire surface using Electron Backscattered Diffraction (EBSD) method].

The coating layer may contain one or more dopants selected from the first additive element, the second additive element and the third additive element described later, for example. Preferable contents of these dopants are described later.

In an embodiment, the coating layer consists of Pd, Ni and Au; and inevitable impurities. In another embodiment, the coating layer consists of Pd, Ni and Au; one or more elements selected from the first additive element, the second additive element and the third additive element described later; and inevitable impurities. The term "inevitable impurities" used in relation to the coating layer encompasses elements constituting the Cu core material.

The wire of the present invention may further contain one or more elements selected from the group consisting of B, P, In and Mg ("first additive element"). When the wire of the present invention contains the first additive element, the total concentration of the first additive element is preferably 1 ppm by mass or more relative to the entire wire. This makes it possible to provide a bonding wire that achieve a more favorable compression-bonding shape of the 1st bonding part. The total concentration of the first additive element relative to the entire wire is more preferably 2 ppm by mass or more, and further preferably 3 ppm by mass or more, 5 ppm by mass or more, 8 ppm by mass or more, 10 ppm by mass or more, 15 ppm by mass or more, or 20 ppm by mass or more. From the viewpoint of suppressing hardening of the wire and reducing chip damage at the time of 1st bonding, the total concentration of the first additive element is preferably 100 ppm by mass or less, and more preferably 90 ppm by mass or less, 80 ppm by mass or less, 70 ppm by mass or less, 60 ppm by mass or less or 50 ppm by mass or less. Accordingly, in a preferable embodiment, the wire of the present invention contains the first additive element, and the total concentration of the first additive element is 1 ppm by mass or more and 100 ppm by mass or less relative to the entire wire.

When the wire of the present invention contains the first additive element, the first additive element may be contained in either one of the Cu core material and the coating layer, or may be contained in both of them. The first additive element is preferably contained in the Cu core material from the viewpoint of providing a bonding wire that achieves a further favorable compression-bonding shape of the 1st bonding part.

The wire of the present invention may further contain one or more elements selected from the group consisting of Se, Te, As and Sb ("second additive element"). When the wire of the present invention contains the second additive element, the total concentration of the second additive element is preferably 1 ppm by mass or more relative to the entire wire. This makes it possible to improve the bond reliability of the 1st bonding part in a high-temperature and high-humidity environment. The total concentration of the second additive element relative to the entire wire is more preferably 2 ppm by mass or more, and further preferably 3 ppm by mass or more, 5 ppm by mass or more, 8 ppm by mass or more, 10 ppm by mass or more, 15 ppm by mass or more, or 20 ppm by mass or more. From the viewpoint of achieving a favorable compression-bonding shape of the 1st bonding part, the total concentration of the second additive element is preferably 100 ppm by mass or less, and further preferably 90 ppm by mass or less, 80 ppm by mass or less, 70 ppm by mass or less, 60 ppm by mass or less, or 50 ppm by mass or less. Accordingly, in a preferable embodiment, the wire of the present invention contains the second additive element, and the total concentration of the second additive element is 1 ppm by mass or more and 100 ppm by mass or less relative to the entire wire.

When the wire of the present invention contains the second additive element, the second additive element may be contained in either one of the Cu core material and the coating layer, or may be contained in both of them. From the viewpoint of providing a bonding wire that achieves a further favorable bond reliability of the 1st bonding part in a high-temperature and high-humidity environment, the second additive element is preferably contained in the coating layer.

The wire of the present invention may further contain one or more elements selected from the group consisting of Ga, Ge and Ag ("third additive element"). When the wire of the present invention contains the third additive element, the total concentration of the third additive element is preferably 0.011% by mass or more relative to the entire wire. This makes it possible to improve the bond reliability of the 1st bonding part in a high-temperature environment. The total concentration of the third additive element relative to the entire wire is more preferably 0.015% by mass or more, and more preferably 0.02% by mass or more, 0.025% by mass or more, 0.03% by mass or more, 0.031% by mass or more, 0.035% by mass or more, 0.04% by mass or more, 0.05% by mass or more, 0.07% by mass or more, 0.09% by mass or more, 0.1% by mass or more, 0.12% by mass or more, 0.14% by mass or more, 0.15% by mass or more, or 0.2% by mass or more. From the viewpoint of achieving a favorable compression-bonding shape of the 1st bonding part, and a favorable bondability of the 2nd bonding part, the total concentration of the third additive element is preferably 1.5% by mass or less, and more preferably 1.4% by mass or less, 1.3% by mass or less or 1.2% by mass or less. Accordingly, in a preferable embodiment, the wire of the present invention contains the third additive element, and the total concentration of the third additive element is 0.011% by mass or more and 1.5% by mass or less relative to the entire wire.

When the wire of the present invention contains the third additive element, the third additive element may be contained in either one of the Cu core material and the coating layer, or may be contained in both of them.

The contents of the first additive element, the second additive element and the third additive element in the wire can be measured by the method described in [Measurement of element content] described later.

<Other Preferable Conditions>

There will be described further conditions that the wire of the present invention preferably satisfies.

The wire of the present invention preferably satisfies one or more conditions selected from the following conditions (6) and (7), in addition to the conditions (1) to (5).

(6) In a concentration profile in a depth direction of the wire obtained by performing measurement using AES, a thickness da of a region where the Au concentration $C_{Au}$ is 10 atomic % or more is 0.5 nm or more and 25 nm or less.

(7) When measuring crystal orientations on the surface of the wire by using the EBSD method, a crystal orientation <111> angled at 15° or less to a wire longitudinal direction has a proportion of 30% or more and 95% or less among crystal orientations in the wire longitudinal direction.

—Condition (6)—

The condition (6) relates to the thickness da of the region where the Au concentration $C_{Au}$ is 10 atomic % or more in a concentration profile in a depth direction of the wire.

By including the coating layer that satisfies the condition (6) in combination with the conditions (1) to (5), the wire of the present invention can achieve a favorable initial bondability of the 2nd bonding part (hereinafter also referred to as a "2nd bondability") even in a case where the 2nd bonding is performed at lower temperature (for example, 175° C.). In addition, there can be also achieved the 2nd bonding part that provides a favorable bond reliability in a rigorous high-temperature environment of 200° ° C., even when employing such low-temperature bonding.

Regarding the condition (6), the thickness da of the region where the Au concentration $C_{Au}$ is 10 atomic % or more in a concentration profile in a depth direction of the wire is preferably 0.5 nm or more, more preferably 1 nm or more, 2 nm or more, or 3 nm or more, further preferably 4 nm or more, 5 nm or more, or 6 nm or more, and the upper limit thereof is preferably 25 nm or less, 20 nm or less, 15 nm or less, or 14 nm or less, more preferably 12 nm or less, from the viewpoint of achieving a favorable 2nd bondability when employing a low-temperature bonding and achieving the 2nd bonding part that provides a favorable bond reliability in a rigorous high-temperature environment even when employing the low-temperature bonding. It is particularly preferable that the thickness da of the region falls within a range from 4 nm to 12 nm, because a favorable 2nd bondability can be readily achieved even when the bonding temperature is as low as 175° C. and the 2nd bonding part that provides a favorable bond reliability in a rigorous high-temperature environment can be readily achieved even when employing such low-temperature bonding.

In a concentration profile in a depth direction of the wire, the thickness da of the region where the Au concentration $C_{Au}$ is 10 atomic % or more can be determined, by confirming the concentration profile from the wire surface toward the center of the wire, as a distance from a wire surface position Z0 to a depth position Z2 where the Au concentration decreases less than 10 atomic % for the first time. Similar to the above-mentioned conditions (1) to (3), it is preferable to obtain concentration profiles in a depth direction of the wire for measuring surfaces at a plurality of points (n≥3) which are separated from each other by 1 mm or more in the wire longitudinal direction, and employ an arithmetic average value thereof.

The thickness da of the region where the Au concentration $C_{Au}$ is 10 atomic % or more in the condition (6) is based on results of measurement under the conditions described in [Thickness analysis of coating layer using Auger electron spectroscopy (AES)] described later.

—Condition (7)—

The condition (7) relates to a proportion of a crystal orientation <111> angled at 15° or less to a wire longitudinal direction among crystal orientations in the wire longitudinal direction when measuring crystal orientations on the surface of the wire by using the EBSD method (hereinafter simply also referred to as a "proportion of the crystal orientation <111> on the surface of the wire").

As described above, a bonding process of a bonding wire is carried out by performing 1st bonding of a wire part onto an electrode on the semiconductor chip; forming a loop; and finally performing 2nd bonding of a wire part onto an external electrode such as the lead frame or the electrode on the substrate. By including the coating layer that satisfies the condition (7) in combination with the conditions (1) to (5), there can be achieved a bonding wire capable of stably forming a desired loop shape.

Regarding the condition (7), from the viewpoint of achieving the wire exhibiting a favorable loop shape stability, the proportion of the crystal orientation <111> on the surface of the wire is preferably 30% or more, more preferably 35% or more, further preferably 40% or more, 45% or more, 50% or more, 55% or more, or 60% or more, and the upper limit thereof is preferably 95% or less, more preferably 90% or less, further preferably 85% or less, 84% or less, 82% or less, or 80% or less. In particular, when the proportion of the crystal orientation <111> on the surface of the wire falls within a range from 40% or more and 85% or less, there can be achieved the bonding wire that exhibits a particularly favorable loop shape stability.

The proportion of the crystal orientation <111> on the surface of the wire is obtained by measuring crystal orientations on the surface of the wire using the EBSD method. The device and the analysis software used for the EBSD method are as described above in relation to the condition (5). Also, the measuring surface is the surface of the wire as described above, and the position and dimensions of the measuring surface are as described above. Further, as described above in relation to the condition (5), the calculation is performed, in the analysis, by employing only the crystal orientation identified based on a certain reliability among the measuring surface while excluding a part in which the crystal orientation cannot be measured, a part in which the crystal orientation can be measured but reliability of orientation analysis is low, or the like. In the present invention, as for the proportion of the crystal orientation <111> on the surface of the wire, it is preferable to perform the measurement for measuring surfaces at a plurality of points (n≥3) which are separated from each other by 1 mm or more in the wire longitudinal direction, and employ an arithmetic average value thereof.

The proportion of the crystal orientation <111> on the surface of the wire tends to fall within a desired range by adjusting the concentration ratio of Pd and Ni in the coating layer, the processing degree in the wire-drawing, and the heating condition and the like. Regarding the condition for increasing the proportion of the crystal orientation <111> on the surface of the wire, it can be adjusted by, for example, decreasing the concentration ratio of Pd/Ni in the coating layer, increasing the processing degree, employing the heating condition at lower temperature for shorter time, and the kike.

The proportion of the crystal orientation <111> on the surface of the wire in the condition (7) is based on a result of measurement under the conditions described in [Crystal analysis of wire surface using Electron Backscattered Diffraction (EBSD) method].

The diameter of the wire of the present invention is not particularly limited and may be appropriately determined according to a specific purpose. The lower limit of the diameter may be preferably 15 μm or more, or 16 μm or more, for example. The upper limit of the diameter may be preferably 80 μm or less, 70 μm or less, or 50 μm or less, for example. As described above, the wire of the present invention satisfying all of the specific conditions (1) to (5) can reduce a galvanic corrosion in a rigorous high-temperature environment to achieve a favorable bond reliability of the 2nd bonding part even in a case where the wire has a small diameter. From the view point of further achieving such effect of the present invention, the diameter of the wire of the present invention may be 20 μm or less, 18 μm or less, for example.

<Manufacturing Method for Wire>

There will be described an example of a method for manufacturing the bonding wire for semiconductor devices according to the present invention.

First, raw material copper of high purity (4N to 6N; 99.99 to 99.9999% by mass or more) is processed into a large diameter (diameter of about 3 to 6 mm) by continuous casting to obtain an ingot.

In a case of adding a dopant such as the first additive element, the second additive element and the third additive element described above, examples of an addition method therefor may include a method of causing the dopant to be contained in the Cu core material, a method of causing the dopant to be contained in the coating layer, a method of depositing the dopant on the surface of the Cu core material, and a method of depositing the dopant on the surface of the coating layer. These methods may be combined with each other. The effect of the present invention can be achieved by employing any addition method. In the method of causing the dopant to be contained in the Cu core material, a copper alloy containing a required concentration of dopant may be used as a raw material to manufacture the Cu core material. In a case of obtaining such a copper alloy by adding the dopant to Cu as the raw material, a dopant component having high purity may be directly added to Cu, or alternatively, a mother alloy containing a dopant component at a concentration of about 1% may be used. In the method of causing the dopant to be contained in the coating layer, the dopant may be contained in Pd, Ni, Au plating bath at the time of forming the coating layer (in a case of wet plating), or in a target material (in a case of dry plating). In the method of depositing the dopant on the surface of the Cu core material and the method of depositing the dopant on the surface of the coating layer, at least one type of deposition treatment selected from (1) application of aqueous solution-⇒drying⇒heat treatment, (2) a plating method (wet), and (3) a vapor deposition method (dry) may be performed with the surface of the Cu core material or the surface of the coating layer as a deposition surface.

The ingot having a large diameter is subjected to forging, rolling, and wire-drawing to manufacture a wire with a diameter of about 0.7 to 2.0 mm (hereinafter also referred to as an "intermediate wire").

As a method for forming the coating layer on the surface of the Cu core material, an electroplating, an electroless plating, a vapor deposition, and the like can be used. Among them, the electroplating is preferable industrially because it can stably control film thickness. For example, the coating layer may be formed on the surface of the ingot having large diameter. The coating layer may be formed on the surface of the intermediate wire, or the coating layer may be formed on the surface of the Cu core material after further thinning the intermediate wire by performing the wire-drawing (for example, after carrying out the wire-drawing to a final diameter of the Cu core material). Among them, the coating layer is preferably formed at a stage where the Cu core material has a large diameter of 50 to 500 times as large as the final wire diameter because the width of crystal grain at the surface of the wire in the above-mentioned condition (5) can be readily adjusted to a desired range. It is therefore preferable that the coating layer is formed on the surface of the ingot having large diameter. This is because, when the coating layer is formed at a stage where the Cu core material has a large diameter, the processing degree of the coating layer can be increased in the following wire-drawing process and the like, and thus the crystal grain can be finer at the final wire diameter.

The coating layer may be formed by, for example, providing a Pd—Ni alloy layer containing Pd and Ni at a certain ratio on the surface of the Cu core material. Alternatively, from the viewpoint of forming the coating layer with an excellent adhesiveness to the Cu core material, the coating layer may be formed by performing a strike plating with conductive metal on the surface of the Cu core material and then providing the Pd—Ni alloy layer containing Pd and Ni at the predetermined ratio thereon. Further, after forming the Pd—Ni alloy layer containing Pd and Ni at a certain ratio, a layer containing at least one of Pd and Ni (e.g., a Pd layer, an Ni layer, or a Pd—Ni alloy layer) may be further provided. As described above, the wire of the present invention includes the coating layer containing Au at the surface thereof. Such coating layer may be formed by providing an Au layer on the surface of the coating layer according to the same method as described above.

The wire-drawing process can be performed by using a continuous wire-drawing machine in which a plurality of diamond-coated dies can be set. If necessary, heat treatment may be performed during the wire-drawing process. The constituent elements are diffused to each other between the Au layer at the surface of the wire and the lower Pd—Ni alloy layer (the Pd layer, the Ni layer, or the Pd—Ni alloy layer, if provided) by the heat treatment, which makes it possible to form a region containing Au (e.g., an alloy region containing Au, Pd and Ni) at the surface of the wire and to adjust the Au concentration at the surface of the wire so that the above-described condition (4) is satisfied. As a method therefor, a method that promotes alloying by continuously sweeping (feeding) the wire at a constant speed in an electric furnace at a constant furnace temperature is preferable in that the composition and thickness of the alloy can surely be controlled. In substitution for the method of forming the region containing Au by providing the Au layer on the surface of the coating layer and then performing the heat treatment, a method of depositing an alloy region originally containing Au and at least one of Pd and Ni may be employed.

Hereinafter, regarding an embodiment of forming the coating layer on the surface of the Cu core material by an electroplating, there will be exemplified a preferable embodiment from the viewpoint of adjusting the width of crystal grain at the surface of the wire in the above-described condition (5) into a desired range.

In such preferable embodiment, the width of crystal grain at the surface of the wire is adjusted into a desired range by controlling conditions of an electroplating, a wire-drawing process and a heat treatment.

First, in the electroplating process, the temperature of a plating bath is controlled to a low-temperature of preferably 60°C or less, more preferably 50° C. or less, from the viewpoint of suppressing the growth of crystal grains by inducing the nucleation of Pd and Ni. The lower limit of a plating bath is not particularly limited as long as the electroplating can be performed successfully, and may be 10° C. or more, 15° C. or more, 20° ° C. or more, for example. Also, in the electroplating process, a plating is preferably performed in a liquid-flow state by stirring the plating liquid, from the viewpoint of suppressing the growth of crystal grains by inducing the nucleation of Pd and Ni. Accordingly, in a preferable embodiment, in the electroplating process, a plating is performed in a plating bath of 10 to 60° C. (more preferably 10 to 50° C.) in a liquid-flow state.

Further, as for the wire-drawing process and the heat treatment, an intermediate heat treatment is preferably performed in the middle of the wire-drawing process where the diameter of the wire is in a range of 5 to 50 times as large as the final wire diameter. This is because, by performing a moderate intermediate heat treatment, the processing distortion in the coating layer is controlled, and thus the size of crystal grain at the final wire diameter can be readily controlled.

In a particularly preferable embodiment, the coating layer is formed on the surface of the Cu core material by performing an electroplating process in a plating bath of 10 to 60° C. in a liquid-flow state as a stage where the Cu core material has a large diameter of 50 to 500 times as large as the final wire diameter. Further, it is preferable to subject the wire to the wire-drawing process, followed by performing an intermediate heat treatment in the middle of the wire-drawing process where the diameter of the wire is in a range of 5 to 50 times as large as the final wire diameter.

The wire of the present invention can reduce a galvanic corrosion to achieve a favorable bond reliability of the 2nd bonding part even in a case where the wire has a small diameter or in a case where the wire is exposed to a rigorous high-temperature environment of 200° C. Thus, the bonding wire of the present invention can be suitably used as bonding wires particularly for on-vehicle devices and power devices.

[Method for Manufacturing Semiconductor Device]

The semiconductor device can be manufactured by connecting the electrode on the semiconductor chip to the lead frame or the electrode on the circuit board by using the bonding wire for semiconductor devices of the present invention.

In an embodiment, the semiconductor device according to the present invention includes a circuit board, a semiconductor chip, and a bonding wire for electrically connecting the circuit board and the semiconductor chip with each other, and is characterized in that the bonding wire is the wire of the present invention.

In the semiconductor device according to the present invention, the circuit board and the semiconductor chip are not particularly limited, and a known circuit board and semiconductor chip that may be used for constituting the semiconductor device may be used. Alternatively, a lead frame may be used in place of the circuit board. For example, like the semiconductor device disclosed in JP 2020-150116 A, the semiconductor device may include a lead frame and a semiconductor chip mounted on the lead frame.

Examples of the semiconductor device may include various semiconductor devices used for electric products (for example, a computer, a cellular telephone, a digital camera, a television, an air conditioner, a solar power generation system), vehicles (for example, a motorcycle, an automobile, an electric train, a ship, and an aircraft), and the like.

EXAMPLES

There will be specifically described the present invention with Examples. However, the present invention is not limited to the Examples described below.

(Sample)

First, the method of preparing a sample will be described. For Cu as a raw material of the Cu core material, Cu having a purity of 99.99% by mass or more (4N) with the balance composed of inevitable impurities was used. In a case of adding the first additive element, the second additive element or the third additive element, an additive element having a purity of 99% by mass or more with the balance composed of inevitable impurities was used, or alternatively a mother alloy of Cu with a high concentration of these additive elements was used.

For the Cu alloy as the core material, the raw material was first charged into a graphite crucible and melted by heating to 1090 to 1500° C. in an inert atmosphere such as an Ne gas or Ar gas using a high-frequency furnace. Then, an ingot with a diameter of 4 to 7 mm was obtained by continuous casting. Next, onto the ingot thus obtained, the coating layer was formed by the electroplating method. For forming the coating layer, an acid washing with hydrochloric acid or sulfuric acid was performed to remove an oxide film on the surface of the ingot, and then a Pd—Ni alloy layer containing Pd and Ni at a predetermined ratio was formed by using a Pd—Ni alloy plating liquid containing Pd and Ni at a predetermined ratio so as to cover the entire surface of the ingot. Furthermore, an Au layer was provided on the Pd—Ni alloy layer. The forming of the Pd—Ni alloy layer and the Au layer using the electroplating method was performed in a state where the temperature of the plating bath was from 20° C. to 40° C. and the plating liquid was in a liquid-flow state by stirring the plating liquid.

Thereafter, the wire was further subjected to a drawing processing, a wire-drawing processing and the like to be processed to have a final wire diameter. In the middle of the processing, the intermediate heat treatment was performed 1 to 2 times as needed for adjusting the width of crystal grain in the vicinity of wire surface. Regarding the condition of the intermediate heat treatment, the heat treatment was performed at a stage where the wire diameter was from 0.1 mm to 0.3 mm, the heat treatment temperature was from 200 to 600° C. and the heat treatment time was from 1 to 6 seconds. The intermediate heat treatment was performed while continuously sweeping (feeding) the wire under flowing of an Ne gas or Ar gas. After the wire was processed to have the final wire diameter, a refining heat treatment was performed while continuously sweeping the wire under flowing of an Ne gas or Ar gas. The heat treatment temperature for the refining heat treatment was 200 to 600° C., the wire feeding speed was 20 to 200 m/min, and the heat treatment time was 0.2 to 0.8 seconds. If the coating layer was thin or the width of crystal grain was to be decreased, the heat treatment temperature was set to be lower or the wire feeding speed was set to be higher. If the coating layer was thick or the width of crystal grain was to be increased, the heat treatment temperature was set to be higher or the wire feeding speed was set to be lower.

(Test and Evaluation Methods)

There will be described test and evaluation methods.

[Composition Analysis of Wire Surface Using Auger Electron Spectroscopy (AES)]

The Au concentration $C_{Au}$ at the surface of the wire was determined by performing a measurement using the Auger electron spectroscopy (AES) where the measuring surface was a surface of the wire as follows.

First, the bonding wire to be measured was fixed to the sample holder in a linear arrangement. Next, the measuring surface was determined so that the center of width of the measuring surface was aligned with the center of width of the wire in the direction perpendicular to the wire axis, and the width of the measuring surface was 5% or more and 15% or less of the diameter of the wire. The length of the measuring surface was set to be five times the width of the measuring surface. With using an AES device (PHI-700 manufactured by ULVAC-PHI, INC.), the composition analysis was performed on the surface of the wire under a condition of acceleration voltage of 10 kV to obtain a surface Au concentration (atomic %).

The composition analysis using the AES was performed on the measuring surfaces at three points which were separated from each other by 1 mm or more in the wire longitudinal direction, and an arithmetic average value thereof was employed. When determining the Au concentration at the surface, a gas component such as carbon (C), sulfur (S), oxygen (O), or nitrogen (N), a nonmetallic element, and the like were not considered.

[Thickness Analysis of Coating Layer Using Auger Electron Spectroscopy (AES)]

A depth analysis using AES was used for the thickness analysis of the coating layer. The depth analysis using AES analyzes a change in a composition in the depth direction by alternately performing a composition analysis and sputtering, so that a change in concentration of each element in the direction from the surface of the wire toward the depth (center) of the wire (so-called a concentration profile in the depth direction) can be obtained.

Specifically, the concentration profile in the depth direction was obtained with AES by performing 1) a composition analysis of the wire surface, and then repeating 2) a sputtering treatment with Ar and 3) a surface composition analysis after the sputtering treatment. The sputtering treatment in 2) was performed at an acceleration voltage of 2 kV with Ar+ ion. In the surface composition analysis in 1) and 3), the dimensions of the measuring surface and the conditions for the composition analysis by the AES were the same as those described in [Composition analysis of wire surface using Auger electron spectroscopy (AES)] described above. For obtaining the concentration profile in the depth direction using AES, the measurement was performed so that the number of measurement points in the depth direction is 50 or more for the coating layer.

The concentration profile in the depth direction was obtained for the measuring surfaces at three points which were separated from each other by 1 mm or more in the wire longitudinal direction.

—Thickness Dt of Coating Layer and Total Number of Measurement Points in Coating Layer—

In the obtained concentration profile in the depth direction, the concentration profile was confirmed from the wire surface toward the center of the wire to obtain a distance from a wire surface position zo to a depth position Z1 where the concentration of the core material Cu reaches 50 atomic % for the first time as a measured thickness of the coating layer. Further, the total number of measurement points from the wire surface position zo to the depth position Z1 was obtained as the total number of measurement points in the coating layer. The arithmetic average value of numerical values obtained for the measuring surfaces at three points was employed as the thickness dt of the coating layer. It was confirmed that the total number of measurement points in the coating layer was 50 to 100 for the wires of the Examples.

Note that the depth measured by the AES analysis is obtained as the product of the sputtering rate and time. Since the sputtering rate is generally measured using a reference sample $SiO_2$, the depth analyzed using AES is represented by an $SiO_2$ equivalent value. Thus, the unit for the thickness of the coating layer was in terms of $SiO_2$.

—Average Value of $C_{Pd}+C_{Ni}$—

In the obtained concentration profile in the depth direction, the sum of the Pd concentration $C_{Pd}$ (atomic %) and the Ni concentration Chi (atomic %), $C_{Pd}+C_{Ni}$, for all measurement points in the coating layer was arithmetically averaged to obtain the average value. The arithmetic average value of numerical values obtained for the measuring surfaces at three points was employed as the average value of $C_{Pd}+C_{Ni}$.

—Average Value of Ratio $C_{Pd}/C_{Ni}$—

In the obtained concentration profile in the depth direction, the ratio of the Pd concentration $C_{Pd}$ (atomic %) to the Ni concentration $C_{Ni}$ (atomic %), $C_{Pd}/C_{Ni}$, for all measurement points in the coating layer was arithmetically averaged to obtain the average value. The arithmetic average value of numerical values obtained for the measuring surfaces at three points was employed as the average value of ratio $C_{Pd}/C_{Ni}$.

—Thickness Da of Region where $C_{Au}$ is 10 Atomic % or More—

In the obtained concentration profile in the depth direction, the concentration profile was confirmed from the wire surface toward the center of the wire to obtain a distance from a wire surface position Z0 to a depth position Z2 where the Au concentration decreased less than 10 atomic % for the first time as a thickness of the region where $C_{Au}$ is 10 atomic % or more. The arithmetic average value of numerical values obtained for the measuring surfaces at three points was employed as the thickness da of the region where $C_{Au}$ is 10 atomic % or more.

Regarding to the above [Composition analysis of wire surface using Auger electron spectroscopy (AES)] and [Thickness analysis of coating layer using Auger electron spectroscopy (AES)], the peaks used for identifying each element of Pd, Au, Ni and Cu were as follows. Specifically, by focusing on the energy value of negative peak of each element in the differential spectrum of Auger electron (hereinafter referred to as an "Auger electron spectrum"), the peaks of Au (2022 eV), Pd (333 eV), Ni (849 eV) and Cu (922 eV) were used.

The analysis software attached to the AES device (PHI MultiPak) was used to perform the analysis of the Auger electron spectrum and the calculation of concentration. For the analysis, Linear Least Squares (LLS processing) was conducted as needed. Specifically, the LLS processing was conducted for separating the peaks of Cu and Ni. More specifically, when analyzing the objective sample, a pure Cu and a pure Ni had been used to obtain Auger electron spectra and then the LLS processing was conducted using the obtained spectra as the data of reference samples. In a case when both of a region containing Cu but not containing Ni (Cu-containing region) and a region containing Ni but not containing Cu (Ni-containing region) existed in the objective sample, the LLS processing was conducted in the concentration analysis of Ni element and Cu element using the Auger electron spectra of the Cu-containing region and the Ni-containing region as the data of element reference samples. Further, with regard to the objective sample containing Au, the LLS processing was conducted for reducing a background noise. The LLS processing was conducted based on the waveform of Auger electron spectrum near the above-described energy value of the Au peak among the entire Auger electron spectrum.

[Crystal Analysis of Wire Surface Using Electron Backscattered Diffraction (EBSD) Method]

The crystal analysis of the surface of the wire was performed by the EBSD method where the measuring surface was a surface of the wire.

—Width of Crystal Grain at Surface of Wire—

First, the bonding wire with the diameter of 18 μm or 20 μm to be measured was fixed to the sample holder in a linear arrangement. Next, the measuring surface was determined so that the center of width of the measuring surface was aligned with the center of width of the wire in the direction perpendicular to the wire axis (the circumferential direction of the wire) and the width of the measuring surface was 7 μm and the length of the measuring surface was 15 μm. With using an EBSD measuring device (SU-70 manufactured by Hitachi High-Tech Corporation), the measurement was performed under a condition of the measuring magnification of 15,000 times and the interval of measurement points of 0.03 μm. In the measurement, the acceleration voltage was optimized in a range from 15 to 30 kV according to the surface state of the sample. Then, the analysis was performed using the analysis software attached to the EBSD device (OIM analysis manufactured by TSL solutions) by excluding the measurement points in which the CI value (Confidence Index) is less than 0.1. The average size of crystal grains in the circumferential direction of the wire, that is, the width of crystal grain (nm) was obtained by defining the boundary at which an orientation difference between adjacent measurement points is 5° or more as the crystal grain boundary. The lower limit of the number of pixels or the pixel number for identifying a crystal grain (corresponding to "Minimum size" in the item "Grain size" in the setting of the software attached to the device) was set to the value of 2 to 5. In the analysis, the crystal data of Pd (fcc, lattice constant) was used when the concentration ratio of Pd and Ni, $C_{Pd}/C_{Ni}$, in the coating layer was 1 or more, and the crystal data of Ni (fcc, lattice constant) was used when the concentration ratio of Pd and Ni, $C_{Pd}/C_{Ni}$, in the coating layer was less than 1.

The calculation of the width of crystal grain at the surface of the wire using the analysis software was conducted by: (i) drawing a line in the width direction of the measuring surface (the circumferential direction of the wire) to determine the size of each crystal grain in the circumferential direction of the wire from intervals of crystal grain boundaries on the line; and (ii) arithmetically averaging the size of each crystal grain in the circumferential direction of the wire to calculate the average size of crystal grains in the circumferential direction of the wire. This calculation was conducted for a plurality of lines (the number of lines N was from 20 to 50) which were separated from each other in the wire longitudinal direction, and the average value thereof was employed as the width of crystal. In the analysis software, by setting the number of lines N, the lines were automatically set at equal intervals.

—Crystal Orientation on Surface of Wire—

In the same manner as described above, the bonding wire to be measured was fixed to the sample holder, and the measuring surface was determined. Then, the crystal orientation on the surface of the wire was observed to obtain the proportion of a crystal orientation <111> angled at 15° or less to a wire longitudinal direction among crystal orientations in the wire longitudinal direction.

The measurement of the crystal orientation using the EBSD method was performed for measuring surfaces at three points which were separated from each other by 1 mm or more in the wire longitudinal direction, and the arithmetic average value thereof was employed.

[Measurement of Element Content]

The contents of the first additive element, the second additive element, and the third additive element in the wire were detected as the concentration of elements contained in the entire wire by analyzing a liquid in which the bonding wire was dissolved with a strong acid using an ICP emission spectrometer or an ICP mass spectrometer. As an analysis device, ICP-OES ("PS3520UVDDII" manufactured by Hitachi High-Tech Corporation) or ICP-MS ("Agilent 7700x ICP-MS" manufactured by Agilent Technologies, Inc.) was used.

[Bond Reliability of 2nd Bonding Part]

The bond reliability of the 2nd bonding part was evaluated by a High Temperature Storage Life Test (HTSL).

—Bond Reliability of 2nd Bonding Part when Employing 200° ° C. Bonding—

A sample was prepared by performing wedge bonding onto leads of a lead frame using the commercially available wire bonder. The resultant sample was sealed by a commercially available thermosetting epoxy resin to manufacture a sample for testing the bond reliability of the 2nd bonding part. An Fe-42 atomic % Ni alloy lead frame plated with 1 to 3 μm Ag was used for the lead frame. The bonding was performed at the stage temperature of 200° C. while flowing an $N_2$+5% He gas at a flow rate of 0.5 L/min. The manufactured sample for testing the bond reliability of the 2nd bonding part was exposed to a high temperature environment of 200° ° C. using a high-temperature thermostatic device. The pull test on the wedge bonded part was performed every 500 hours, and a time until a value of pull force became half of the initial pull force was determined to be the bonding life of the 2nd bonding part. An arithmetic average value of measurement values of 50 wedge bonded parts randomly selected was used for the value of the pull force. The pull test after the High Temperature Storage Life Test was performed after removing the resin by acid treatment, and exposing the wedge bonded part. Evaluation was then performed in accordance with the following criteria.

Evaluation criteria:
⊚⊚: Bonding life of 2000 hours or more
⊚: Bonding life of 1000 hours or more and less than 2000 hours
○: Bonding life of 500 hours or more and less than 1000 hours
X: Bonding life of less than 500 hours —Bond Reliability of 2nd Bonding Part when Employing 175° C. Bonding (Low-Temperature Bonding)—

The sample for testing the bond reliability of the 2nd bonding part was prepared and the bond reliability of the 2nd bonding part was evaluated in the same manner as described above except that the stage temperature was set to be 175° C.

[Bond Reliability of 1st Bonding Part]

The bond reliability of the 1st bonding part was evaluated by both of the Highly Accelerated Temperature and Humidity Stress Test (HAST) and the High Temperature Storage Life Test (HTSL).

—HAST—

A sample was prepared by performing ball bonding on an electrode that was disposed by depositing an Al-1.0 mass % Si—0.5 mass % Cu alloy having a thickness of 1.5 μm on a silicon substrate on a general metal frame. The resultant sample was sealed by a commercially available thermosetting epoxy resin to manufacture a sample for testing the bond reliability of the 1st bonding part. The ball was formed with a current value of 30 to 75 mA, an EFO gap of 762 μm, and a tail length of 254 μm while flowing an $N_2$+5% He gas at a flow rate of 0.4 to 0.6 L/min. The diameter of the ball was in the range of 1.5 to 1.9 times the wire diameter. The manufactured sample for testing the bond reliability of the 1st bonding part was exposed to a high-temperature and high-humidity environment with a temperature of 130° C. and a relative humidity of 85% using an unsaturated type pressure cooker tester and was biased with 7 V. The shear test on the ball bonded part was performed every 48 hours, and a time until a value of shear force became half of the initial shear force was determined to be the bonding life of the 1st bonding part. An arithmetic average value of measurement values of 50 ball bonded parts randomly selected was used for the value of the shear force. The shear test was performed after removing the resin by acid treatment, and exposing the ball bonded part. Evaluation was then performed in accordance with the following criteria.

Evaluation criteria:
⊚: Bonding life of 384 hours or more
○: Bonding life of 240 hours or more and less than 384 hours
X: Bonding life of less than 240 hours

—HTSL—

The sample for testing the bond reliability of the 1st bonding part manufactured in the same manner as described above was exposed to an environment with a temperature of 175° C. using a high-temperature thermostatic device. The shear test on the ball bonded part was performed every 500 hours, and a time until a value of shear force became half of the initial shear force was determined to be the bonding life of the 1st bonding part. An arithmetic average value of measurement values of 50 ball bonded parts randomly selected was used for the value of the shear force. The shear test after the High Temperature Storage Life Test was performed after removing the resin by acid treatment, and exposing the ball bonded part. Evaluation was then performed in accordance with the following criteria.

Evaluation criteria:
⊚: Bonding life of 2000 hours or more
○: Bonding life of 1000 hours or more and less than 2000 hours
X: Bonding life of less than 1000 hours

[Loop Shape]

In the evaluation of the loop shape stability, 30 trapezoid loops were formed with a loop length of 2 mm, a height difference between the bonding parts of 250 μm and a loop height of 200 μm, and the loop shape stability (reproducibility of a loop profile) was evaluated based on a standard deviation of the maximum loop height. An optical microscope was used for measuring the height, and evaluation was performed in accordance with the following criteria.

Evaluation criteria:
⊚: 30 was smaller than 20 μm
○: 30 was 20 μm or more and smaller than 30 μm
x: 30 was 30 μm or more

[Compression-Bonding Shape]

The evaluation of the compression-bonding shape of the 1st bonding part (the crushed shape of ball) was carried out by forming a ball using a commercially available wire bonder under the conditions described in the section [Bond reliability of 1st bonding part] noted above, compression-bonding the ball onto an electrode that had been formed by depositing an Al-1.0 mass % Si—0.5 mass % Cu alloy film having a thickness of 1.5 μm on a Si substrate, and observing the bonded part from directly above by an optical microscope (the number of evaluations N=100). In the evaluation of the crushed shape of ball, a case in which a crushed shape was close to true circle was determined to be favorable, and a case in which a crushed shape was an oval shape or a petal shape was determined to be failure. Evaluation was then performed in accordance with the following criteria.

Evaluation criteria:
⊚: 0 failure
○: 1 to 3 failures (no problem for practical use)
Δ: 4 or 5 failures (no problem for practical use)
X: 6 or more failures

[Chip Damage]

The evaluation of the chip damage was carried out by forming a ball using a commercially available wire bonder under the conditions described in the section [Bond reliability of 1st bonding part] noted above, compression-bonding the ball onto an electrode that had been formed by depositing an Al-1.0 mass % Si—0.5 mass % Cu alloy film having a thickness of 1.5 μm on a Si substrate, dissolving the wire and the electrode with a chemical solution to expose the Si substrate, and observing the Si substrate directly below the bonded part by an optical microscope (the number of evaluations N=50). Evaluation was then performed in accordance with the following criteria.

Evaluation criteria:
◎: no crack or bonding traces
Δ: no crack, but there are sites where bonding traces were confirmed (3 sites or less)
X: all others The evaluation results of Examples and Comparative Examples are shown in Tables 1 and 2.

TABLE 1

| | No. | Diameter um | Average value of $C_{Pd} + C_{Ni}$*1 atomic % | Average value of ratio $C_{Pd}/C_{Ni}$*2 | Thickness of coating layer dt nm | $C_{Au}$ at wire surface atomic % | Width of crystal grain at wire surface*3 nm | Thickness of region of $C_{Au} \geq 10$ atomic % da nm | Crystal orientation <111> at wire surface % | First additive element (B, P, In, Mg) ppm by mass |
|---|---|---|---|---|---|---|---|---|---|---|
| Example | 1 | 20 | 77 | 1.2 | 35 | 55 | 45 | 3 | 90 | |
| | 2 | 20 | 83 | 2.3 | 52 | 35 | 35 | 4 | 75 | |
| | 3 | 18 | 92 | 1.8 | 68 | 63 | 50 | 7 | 85 | |
| | 4 | 18 | 74 | 2.5 | 70 | 58 | 68 | 6 | 45 | |
| | 5 | 18 | 82 | 4.0 | 88 | 62 | 85 | 7 | 30 | |
| | 6 | 18 | 86 | 5.8 | 92 | 50 | 105 | 9 | 74 | |
| | 7 | 18 | 91 | 4.5 | 90 | 55 | 120 | 7 | 78 | |
| | 8 | 18 | 75 | 3.3 | 105 | 65 | 165 | 5 | 66 | |
| | 9 | 18 | 82 | 0.3 | 95 | 35 | 132 | 13 | 50 | |
| | 10 | 18 | 84 | 9.2 | 125 | 48 | 138 | 7 | 75 | |
| | 11 | 18 | 70 | 6.8 | 45 | 62 | 35 | 5 | 78 | |
| | 12 | 18 | 81 | 12.4 | 105 | 55 | 103 | 8 | 92 | |
| | 13 | 18 | 87 | 19.6 | 75 | 45 | 137 | 7 | 73 | |
| | 14 | 18 | 75 | 3.5 | 21 | 31 | 75 | 4 | 38 | |
| | 15 | 18 | 82 | 2.8 | 33 | 37 | 81 | 7 | 74 | |
| | 16 | 18 | 75 | 0.8 | 180 | 45 | 113 | 12 | 28 | |
| | 17 | 18 | 88 | 3.2 | 120 | 76 | 85 | 11 | 95 | |
| | 18 | 18 | 87 | 5.2 | 78 | 33 | 102 | 3 | 58 | |
| | 19 | 18 | 72 | 3.1 | 85 | 85 | 74 | 5 | 73 | |
| | 20 | 18 | 87 | 2.3 | 95 | 25 | 68 | 2 | 70 | |
| | 21 | 18 | 65 | 6.3 | 65 | 45 | 148 | 28 | 66 | |
| | 22 | 18 | 82 | 5.5 | 103 | 62 | 48 | 7 | 75 | P50 |
| | 23 | 18 | 75 | 8.5 | 80 | 52 | 62 | 6 | 82 | Mg10 |
| | 24 | 18 | 50 | 3.7 | 117 | 43 | 125 | 8 | 63 | In100 |
| | 25 | 18 | 65 | 6.0 | 82 | 45 | 70 | 6 | 58 | P20, In50 |
| | 26 | 18 | 75 | 3.5 | 80 | 40 | 59 | 14 | 75 | B1 |

| | No. | Second additive element (Se, Te, As, Sb) ppm by mass | Third additive element (Ga, Ge, Ag) mass % | Bond reliability of 2nd bonding part (HTSL) 200° C. bonding | 175° C. bonding | Bond reliability of 1st bonding part HAST | HTSL | Loop shape | Crushed shape | Chip damage |
|---|---|---|---|---|---|---|---|---|---|---|
| Example | 1 | | | ◎◎ | ◯ | ◯ | ◯ | ◯ | ◯ | ◎ |
| | 2 | | | ◎◎ | ◎◎ | ◯ | ◯ | ◎ | ◯ | ◎ |
| | 3 | | | ◎◎ | ◎ | ◯ | ◯ | ◎ | ◯ | ◎ |
| | 4 | | | ◎◎ | ◎◎ | ◯ | ◯ | ◎ | ◯ | ◎ |
| | 5 | | | ◎◎ | ◎◎ | ◯ | ◯ | ◯ | ◯ | ◎ |
| | 6 | | | ◎◎ | ◎◎ | ◯ | ◯ | ◎ | ◯ | ◎ |
| | 7 | | | ◎◎ | ◎ | ◯ | ◯ | ◎ | ◯ | ◎ |
| | 8 | | | ◯ | ◯ | ◯ | ◯ | ◎ | ◯ | ◎ |
| | 9 | | | ◎ | ◯ | ◯ | ◯ | ◎ | ◯ | ◯ |
| | 10 | | | ◎ | ◯ | ◯ | ◯ | ◎ | ◯ | ◎ |
| | 11 | | | ◎ | ◎ | ◯ | ◯ | ◎ | ◯ | ◎ |
| | 12 | | | ◎◎ | ◎ | ◯ | ◯ | ◯ | ◯ | ◎ |
| | 13 | | | ◎ | ◯ | ◯ | ◯ | ◎ | ◯ | ◎ |
| | 14 | | | ◎◎ | ◎ | ◯ | ◯ | ◯ | ◯ | ◎ |
| | 15 | | | ◎◎ | ◎ | ◯ | ◯ | ◎ | ◯ | ◎ |
| | 16 | | | ◎◎ | ◎◎ | ◯ | ◯ | Δ | ◯ | ◎ |
| | 17 | | | ◎◎ | ◎ | ◯ | ◯ | ◯ | ◯ | ◎ |
| | 18 | | | ◎◎ | ◯ | ◯ | ◯ | ◎ | ◯ | ◎ |
| | 19 | | | ◎◎ | ◯ | ◯ | ◯ | ◎ | ◯ | ◎ |
| | 20 | | | ◎◎ | ◯ | ◯ | ◯ | ◎ | ◯ | ◎ |
| | 21 | | | ◯ | ◯ | ◯ | ◯ | ◎ | ◯ | ◎ |
| | 22 | | | ◎◎ | ◎ | ◯ | ◯ | ◎ | ◎ | ◎ |

TABLE 1-continued

| | | | | | | | | |
|---|---|---|---|---|---|---|---|---|
| 23 | ⊚⊚ | ⊚ | ○ | ○ | ⊚ | ⊚ | ⊚ | |
| 24 | ⊚ | ⊚ | ○ | ○ | ⊚ | ⊚ | ⊚ | |
| 25 | ⊚⊚ | ⊚⊚ | ○ | ○ | ⊚ | ⊚ | ⊚ | |
| 26 | ⊚⊚ | ○ | ○ | ○ | ⊚ | ⊚ | ⊚ | |

*[1] Average value of sum of Pd concentration $C_{Pd}$ (atomic %) and Ni concentration $C_{Ni}$ (atomic %), $C_{Pd} + C_{Ni}$, for measurement points in coating layer

*[2] Average value of ratio of Pd concentration $C_{Pd}$ (atomic %) to Ni concentration $C_{Ni}$ (atomic %), $C_{Pd}/C_{Ni}$, for measurement points in coating layer

*[3] Average size of crystal grains in circumferential direction of wire obtained by analyzing wire surface using EBSD method

TABLE 2

| | No. | Diameter um | Average value of $C_{Pd}+C_{Ni}$*[1] atomic % | Average value of ratio $C_{Pd}/C_{Ni}$*[2] | Thickness of coating layer dt nm | $C_{Au}$ at wire surface atomic % | Width of crystal grain at wire surface*[3] nm | Thickness of region of $C_{Au} \geq 10$ atomic % da nm | Crystal orientation <111> at wire surface % | First additive element (B, P, In, Mg) ppm by mass |
|---|---|---|---|---|---|---|---|---|---|---|
| Examples | 27 | 18 | 82 | 4.0 | 88 | 62 | 65 | 7 | 73 | |
| | 28 | 18 | 77 | 2.3 | 35 | 45 | 70 | 6 | 55 | |
| | 29 | 18 | 55 | 4.8 | 68 | 53 | 45 | 11 | 78 | |
| | 30 | 18 | 75 | 12.5 | 92 | 45 | 63 | 6 | 71 | |
| | 31 | 18 | 64 | 6.0 | 75 | 72 | 82 | 5 | 48 | |
| | 32 | 18 | 59 | 1.0 | 80 | 45 | 78 | 6 | 88 | P60 |
| | 33 | 18 | 73 | 2.2 | 162 | 35 | 65 | 11 | 63 | B2, P50 |
| | 34 | 18 | 75 | 6.0 | 80 | 45 | 70 | 6 | 75 | |
| | 35 | 18 | 82 | 3.3 | 88 | 62 | 143 | 7 | 88 | |
| | 36 | 18 | 65 | 4.4 | 132 | 45 | 45 | 6 | 75 | |
| | 37 | 18 | 75 | 6.2 | 80 | 12 | 70 | 2 | 71 | |
| | 38 | 18 | 82 | 18.5 | 88 | 62 | 85 | 7 | 38 | |
| | 39 | 18 | 75 | 5.2 | 80 | 45 | 70 | 6 | 54 | P40 |
| | 40 | 18 | 75 | 2.4 | 80 | 79 | 70 | 7 | 85 | B8 |
| | 41 | 18 | 82 | 4.1 | 88 | 62 | 42 | 10 | 75 | |
| | 42 | 18 | 71 | 5.5 | 80 | 45 | 108 | 9 | 58 | In80 |
| | 43 | 18 | 73 | 4.3 | 80 | 45 | 68 | 7 | 67 | B5, P45 |
| Comparative Examples | 1 | 18 | 81 | 1.5 | 66 | 55 | 33 | 7 | 18 | |
| | 2 | 18 | 70 | 4.3 | 83 | 55 | 210 | 6 | 53 | |
| | 3 | 18 | 72 | 3.1 | 8 | 55 | 155 | 3 | 73 | |
| | 4 | 18 | 72 | 2.4 | 183 | 55 | 92 | 6 | 25 | |
| | 5 | 18 | 59 | 1.5 | 115 | 9 | 65 | 3 | 45 | |
| | 6 | 18 | 65 | 5.6 | 68 | 88 | 132 | 10 | 73 | |
| | 7 | 18 | 74 | — (Pd only) | 115 | 55 | 65 | 7 | 28 | |
| | 8 | 18 | 58 | 22 | 68 | 55 | 103 | 8 | 72 | |
| | 9 | 18 | 40 | 4.6 | 128 | 55 | 119 | 7 | 72 | |

| | No. | Second additive element (Se, Te, As, Sb) ppm by mass | Third additive element (Ga, Ge, Ag) mass % | Bond reliability of 2nd bonding part (HTSL) 200° C. bonding | 175° C. bonding | Bond reliability of 1st bonding part HAST | HTSL | Loop shape | Crushed shape | Chip damage |
|---|---|---|---|---|---|---|---|---|---|---|
| Examples | 27 | Se40 | | ⊚⊚ | ⊚ | ⊚ | ○ | ⊚ | ○ | ⊚ |
| | 28 | As15 | | ⊚ | ○ | ⊚ | ○ | ⊚ | ○ | ⊚ |
| | 29 | Sb80 | | ⊚ | ⊚ | ⊚ | ○ | ⊚ | ○ | ⊚ |
| | 30 | Te 7 | | ⊚⊚ | ⊚⊚ | ⊚ | ○ | ⊚ | ○ | ⊚ |
| | 31 | Sb45, Te48 | | ⊚⊚ | ⊚ | ⊚ | ○ | ⊚ | ○ | ⊚ |
| | 32 | Se18 | | ⊚⊚ | ⊚⊚ | ⊚ | ○ | ○ | ⊚ | ⊚ |
| | 33 | Te15 | | ⊚⊚ | ⊚ | ⊚ | ○ | ⊚ | ⊚ | ⊚ |
| | 34 | | Ga 0.02 | ⊚⊚ | ⊚⊚ | ○ | ⊚ | ⊚ | ○ | ⊚ |
| | 35 | | Ge 0.2 | ⊚ | ○ | ○ | ⊚ | ⊚ | ○ | ⊚ |
| | 36 | | Ga 0.3 | ⊚⊚ | ⊚ | ○ | ⊚ | ⊚ | ⊚ | ⊚ |
| | 37 | | Ag 0.3 | ⊚⊚ | ○ | ○ | ⊚ | ⊚ | ○ | ⊚ |
| | 38 | | Ga 0.2, Ag0.2 | ⊚ | ⊚ | ○ | ⊚ | ⊚ | ○ | ⊚ |
| | 39 | | Ag 1.5 | ⊚⊚ | ⊚ | ○ | ⊚ | ⊚ | ⊚ | ⊚ |
| | 40 | | Ga 0.5 | ⊚ | ○ | ○ | ⊚ | ⊚ | ⊚ | ⊚ |
| | 41 | Se18 | Ga 0.3, Ag0.2 | ⊚ | ⊚ | ○ | ⊚ | ⊚ | ○ | ⊚ |
| | 42 | Te 7 | Ga 0.6 | ⊚⊚ | ⊚ | ⊚ | ○ | ⊚ | ⊚ | ⊚ |
| | 43 | Sb45, Te48 | Ge 0.4 | ⊚⊚ | ⊚ | ⊚ | ○ | ⊚ | ⊚ | ⊚ |

TABLE 2-continued

| | | | | | | | | | |
|---|---|---|---|---|---|---|---|---|---|
| Comparative Examples | 1 | X | X | ○ | ○ | Δ | Δ | ○ | |
| | 2 | X | X | ○ | ○ | ○ | ○ | ○ | |
| | 3 | X | X | X | X | ○ | ○ | ○ | |
| | 4 | X | X | ○ | ○ | Δ | ○ | X | |
| | 5 | X | X | X | ○ | ○ | ○ | ○ | |
| | 6 | X | X | ○ | ○ | ○ | ○ | ○ | |
| | 7 | X | X | X | ○ | Δ | ○ | ○ | |
| | 8 | X | X | ○ | ○ | ○ | ○ | ○ | |
| | 9 | X | X | ○ | ○ | ○ | ○ | ○ | |

*[1] Average value of sum of Pd concentration $C_{Pd}$ (atomic %) and Ni concentration $C_{Ni}$ (atomic %), $C_{Pd} + C_{Ni}$, for measurement points in coating layer
*[2] Average value of ratio of Pd concentration $C_{Pd}$ (atomic %) to Ni concentration $C_{Ni}$ (atomic %), $C_{Pd}/C_{Ni}$, for measurement points in coating layer
*[3] Average size of crystal grains in circumferential direction of wire obtained by analyzing wire surface using EBSD method All of the wires of Example Nos. 1 to 43 included the coating layer that satisfied all of the conditions (1) to (5) specified in this specification, and it was confirmed that they achieved a favorable bond reliability of the 2nd bonding part even in a rigorous high-temperature environment of 200° C. In particular, it was confirmed that the wires in which the width of crystal grain at the surface of the wire was 120 nm or less regarding the condition (5) readily achieved an especially favorable bond reliability of the 2nd bonding part even in a rigorous high-temperature environment.

Further, it was confirmed that the wires of Example Nos. 1 to 20, and 22 to 43 in which the thickness da of the region where the Au concentration $C_{Au}$ was 10 atomic % or more was 0.5 nm or more and 25 nm or less in the concentration profile in a depth direction of the wire obtained by performing measurement using AES, particularly the wires in which the thickness da fell within a preferable range of 4 nm or more and 12 nm or less readily exhibited a favorable bond reliability of the 2nd bonding part in a rigorous high-temperature environment of 200° ° C. even when employing a low-temperature bonding of 175° C.

Furthermore, it was confirmed that the wires of Example Nos. 1 to 15, and 17 to 43, in which a crystal orientation <111> angled at 15° or less to a wire longitudinal direction had a proportion of 30% or more and 95% or less when measuring crystal orientations on the surface of the wire by using the EBSD method, achieved a favorable loop shape. Among them, the wires of Example Nos. 2 to 4, 6 to 11, 13, 15, 18 to 31, 33, 34, 36, 37, and 39 to 43 were confirmed to achieve an especially favorable loop shape.

In addition, it was confirmed that the wires of Example Nos. 22 to 26, 32, 33, 39, 40, 42 and 43 containing the first additive element of 1 ppm by mass or more in total achieved an especially excellent compression-bonding shape of the 1st bonding part. It was confirmed that the wires of Example Nos. 27 to 33, and 41 to 43 containing the second additive element of 1 ppm by mass or more in total achieved an especially excellent bond reliability of the 1st bonding part in a high-temperature and high-humidity environment. It was confirmed that the wires of Example Nos. 34 to 43 containing the third additive element of 0.011% by weight or more in total achieved an especially excellent bond reliability of the 1st bonding part in a high-temperature environment.

On the other hand, the wires of Comparative Example Nos. 1 to 9 included the coating layer that did not satisfy at least one of the conditions (1) to (5) specified in this specification, and it was confirmed that they were poor in the bond reliability of the 2nd bonding part in a rigorous high-temperature environment.

EXPLANATION OF SYMBOLS

1 Bonding wire (wire)
2 Measuring surface
X Center of width of measuring surface
W Width of wire (wire diameter)
$w_a$ Width of measuring surface
$l_a$ Length of measuring surface

The invention claimed is:
1. A bonding wire for semiconductor devices, the bonding wire comprising:
a core material of Cu or Cu alloy; and
a coating layer containing a conductive metal other than Cu formed on a surface of the core material, wherein
in a concentration profile in a depth direction of the wire obtained by performing measurement using Auger electron spectroscopy (AES), an average value of sum of a Pd concentration $C_{Pd}$ (atomic %) and an Ni concentration $C_{Ni}$ (atomic %), $C_{Pd}+C_{Ni}$, for measurement points in the coating layer is 50 atomic % or more, an average value of a ratio of $C_{Pd}$ to $C_{Ni}$, $C_{Pd}/C_{Ni}$, for measurement points in the coating layer is 0.2 or more and 20 or less and a thickness dt of the coating layer is 20 nm or more and 180 nm or less,
an Au concentration $C_{Au}$ at a surface of the wire is 10 atomic % or more and 85 atomic % or less, and
an average size of crystal grains in a circumferential direction of the wire is 35 nm or more and 200 nm or less when the surface of the wire is analyzed by using an Electron Backscattered Diffraction (EBSD) method.

2. The bonding wire according to claim 1, wherein in the concentration profile in the depth direction of the wire obtained by performing the measurement using AES, a thickness da of a region where an Au concentration $C_{Au}$ is 10 atomic % or more is 0.5 nm or more and 25 nm or less.

3. The bonding wire according to claim 1, wherein when measuring crystal orientations on the surface of the wire by using the EBSD method, a crystal orientation <111> angled at 15° or less to a wire longitudinal direction has a proportion of 30% or more and 95% or less.

4. The bonding wire according to claim 1, wherein the concentration profile in the depth direction of the wire is obtained by performing the measurement using AES under the following <Condition> while digging down the wire from its surface in the depth direction by Ar sputtering:
<Condition> a center of width of a measuring surface is aligned with a center of width of the wire, the width of the measuring surface is 5% or more and 15% or less of a diameter of the wire, and a length of the measuring surface is five times the width of the measuring surface.

5. The bonding wire according to claim 1, wherein the concentration of Au at the surface of the wire is measured using AES under the following <Condition>:
<Condition> a center of width of a measuring surface is aligned with a center of width of the wire, the width of the measuring surface is 5% or more and 15% or less of a diameter of the wire, and a length of the measuring surface is five times the width of the measuring surface.

6. The bonding wire according to claim 1, wherein
the bonding wire contains one or more elements selected from the group consisting of B, P, In and Mg (hereinafter referred to as a "first additive element"), and
a total concentration of the first additive element is 1 ppm by mass or more and 100 ppm by mass or less relative to the entire wire.

7. The bonding wire according to claim 1, wherein
the bonding wire contains one or more elements selected from the group consisting of Se, Te, As and Sb (hereinafter referred to as a "second additive element"), and
a total concentration of the second additive element is 1 ppm by mass or more and 100 ppm by mass or less relative to the entire wire.

8. The bonding wire according to claim 1, wherein
the bonding wire contains one or more elements selected from the group consisting of Ga, Ge and Ag (hereinafter referred to as a "third additive element"), and
a total concentration of the third additive element is 0.011% by mass or more and 1.5% by mass or less relative to the entire wire.

9. A semiconductor device comprising the bonding wire according to claim 1.

* * * * *